(12) United States Patent
Kim et al.

(10) Patent No.: US 9,147,500 B2
(45) Date of Patent: Sep. 29, 2015

(54) SEMICONDUCTOR MEMORY DEVICE HAVING RESISTIVE MEMORY CELLS AND METHOD OF TESTING THE SAME

(71) Applicant: Samsung Electronics Co., Ltd., Suwon-si (KR)

(72) Inventors: Hye-Jin Kim, Seoul (KR); Hyung-Rok Oh, Yongin-si (KR); Dong-Seok Kang, Seoul (KR); Dong-Hyun Sohn, Hwaseong-si (KR); Sang-Beom Kang, Hwaseong-si (KR); Chul-Woo Park, Yongin-si (KR); Yun-Sang Lee, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 155 days.

(21) Appl. No.: 13/945,007

(22) Filed: Jul. 18, 2013

(65) Prior Publication Data
US 2014/0022836 A1      Jan. 23, 2014

(30) Foreign Application Priority Data
Jul. 18, 2012  (KR) .......................... 10-2012-0078033

(51) Int. Cl.
| | | |
|---|---|---|
| G11C 11/00 | (2006.01) | |
| G11C 29/10 | (2006.01) | |
| G11C 11/16 | (2006.01) | |
| G11C 29/32 | (2006.01) | |
| G11C 29/34 | (2006.01) | |
| G11C 29/26 | (2006.01) | |

(52) U.S. Cl.
CPC .............. *G11C 29/10* (2013.01); *G11C 11/165* (2013.01); *G11C 29/32* (2013.01); *G11C 29/34* (2013.01); *G11C 11/16* (2013.01); *G11C 2029/2602* (2013.01)

(58) Field of Classification Search
USPC .......................................... 365/158, 194, 201
See application file for complete search history.

(56) References Cited

U.S. PATENT DOCUMENTS

| | | | |
|---|---|---|---|
| 5,809,225 | A | 9/1998 | Ohsawa et al. |
| 6,009,026 | A | 12/1999 | Tamlyn et al. |
| 6,323,664 | B1 | 11/2001 | Kim et al. |
| 6,445,612 | B1 | 9/2002 | Naji |
| 6,639,848 | B2 | 10/2003 | Maejima |

(Continued)

FOREIGN PATENT DOCUMENTS

| | | |
|---|---|---|
| JP | 1994-267294 | 9/1994 |
| JP | 1994-267295 | 9/1994 |

(Continued)

*Primary Examiner* — Pho M Luu
(74) *Attorney, Agent, or Firm* — Muir Patent Law, PLLC

(57) ABSTRACT

A semiconductor memory device includes a memory cell array, a mode register set and a test circuit. The memory cell array includes a plurality of wordlines, a plurality of bitlines, and a plurality of spin-transfer torque magneto-resistive random access memory (STT-MRAM) cells, and each STT-MRAM cell disposed in a cross area of each wordline and bitline, and the STT-MRAM cell includes a magnetic tunnel junction (MTJ) element and a cell transistor. A gate of the cell transistor is coupled to a wordline, a first electrode of the cell transistor is coupled to a bitline via the MTJ element, and a second electrode of the cell transistor is coupled to a source line. The mode register set is configured to set a test mode, and the test circuit is configured to perform a test operation by using the mode register set.

30 Claims, 25 Drawing Sheets

(56) References Cited

U.S. PATENT DOCUMENTS

| | | |
|---|---|---|
| 6,848,067 B2 | 1/2005 | Perner |
| 7,131,033 B1 | 10/2006 | Roper et al. |
| 7,551,495 B2 | 6/2009 | Heo |
| 7,552,369 B2 | 6/2009 | Kawakubo |
| 7,635,993 B2 | 12/2009 | Boeve |
| 7,839,716 B2 | 11/2010 | Kong et al. |
| 8,094,486 B2 * | 1/2012 | Xia et al. ............ 365/158 |
| 8,159,870 B2 * | 4/2012 | Xia ..................... 365/171 |
| 8,169,842 B2 | 5/2012 | Lee |
| 8,264,052 B2 * | 9/2012 | Xia ..................... 257/421 |
| 8,492,860 B2 * | 7/2013 | Zhou et al. ........... 257/421 |
| 8,625,341 B2 * | 1/2014 | Xia ..................... 365/171 |
| 2005/0259504 A1 | 11/2005 | Murtugh et al. |
| 2009/0003117 A1 | 1/2009 | Jeong et al. |
| 2010/0157700 A1 | 6/2010 | Kong et al. |

FOREIGN PATENT DOCUMENTS

| | | |
|---|---|---|
| JP | 1995-072215 | 3/1995 |
| JP | 2001-057100 | 2/2001 |
| JP | 2009-200123 | 9/2009 |
| KR | 2002-0002942 | 1/2002 |
| KR | 0884497 | 4/2004 |
| KR | 1062856 | 7/2011 |

* cited by examiner

SEMICONDUCTOR MEMORY DEVICE HAVING RESISTIVE MEMORY CELLS AND METHOD OF TESTING THE SAME

CROSS-REFERENCE TO RELATED APPLICATION(S)

This application claims priority under 35 USC §119 to Korean Patent Application No. 10-2012-0078033, filed on Jul. 18, 2012, in the Korean Intellectual Property Office (KIPO), the contents of which are incorporated herein in its entirety by reference.

BACKGROUND

Example embodiments relate generally to semiconductor devices, and more particularly to a semiconductor memory device having resistive memory cells and a method of testing a semiconductor memory device.

Semiconductor products require smaller size and higher capacity for processing a large amount of data, and thus it is required to increase an operational speed and an integration degree of memory components included in the semiconductor products. To meet such requirements, various resistive memories have been proposed. For example, magneto-resistive random access memory (MRAM) realizes memory function using change of resistance depending on change of polarity of magnetic materials.

Recently, various methods are being developed for optimizing a semiconductor memory device including the MRAM cells for mobile devices requiring higher speed and low power consumption. Particularly test methods are required to detect fails and enhance performance of the semiconductor memory device including resistive memory cells such as the MRAM cells.

SUMMARY

Some example embodiments provide a semiconductor memory device including resistive memory cells, capable of performing a read leveling test operation using a pattern storage circuit storing a predetermined data pattern.

Some example embodiments provide a semiconductor memory device including resistive memory cells, capable of performing a parallel bit test operation to detect failed cells in a memory cell array.

Some example embodiments provide a semiconductor memory device including resistive memory cells, capable of performing a boundary scan test operation to detect inner connection fail.

According to example embodiments, a semiconductor memory device includes a memory cell array, a mode register set and a test circuit. The memory cell array includes a plurality of wordlines, a plurality of bitlines, and a plurality of spin-transfer torque magneto-resistive random access memory (STT-MRAM) cells. Each STT-MRAM cell disposed in a cross area of each wordline and bitline, and the STT-MRAM cell includes a magnetic tunnel junction (MTJ) element and a cell transistor. The MTJ element includes a free layer, a barrier layer and a pinned layer. A gate of the cell transistor is coupled to a wordline, a first electrode of the cell transistor is coupled to a bitline via the MTJ element, and a second electrode of the cell transistor is coupled to a source line. The mode register set is configured to set a test mode and the test circuit is configured to perform a test operation by using the mode register set.

According to example embodiments, a semiconductor memory device includes a memory cell array including a plurality of non-volatile memory cells, a mode register set configured to set a test operation mode, and a test circuit configured to perform the test operation mode by using the mode register set. The test circuit includes a read leveling command decoder configured to generate a read leveling signal based on values stored in the mode register set, a pattern storage circuit configured to store a predetermined data pattern, and provide the data pattern when the read leveling signal is activated, and a selection circuit configured to output data read from the memory cell array when the read leveling signal is deactivated and output the data pattern provided from the pattern storage circuit when the read leveling signal is activated.

According to example embodiments, a semiconductor memory device includes a first memory cell array including a plurality of magneto-resistive random access memory (MRAM) cells configured to store and read data in a first operation mode of the semiconductor memory device, a second memory cell array including a plurality of MRAM cells configured to store and read data in a second operation mode of the semiconductor memory device, a mode register set configured to set the first and second operation modes, and a data output circuit configured to output the data read from the first memory cell array in the first operation mode and output the data read from the second memory cell array in the second operation mode. The first operation mode is a normal operation mode and the second operation mode is a test operation mode.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
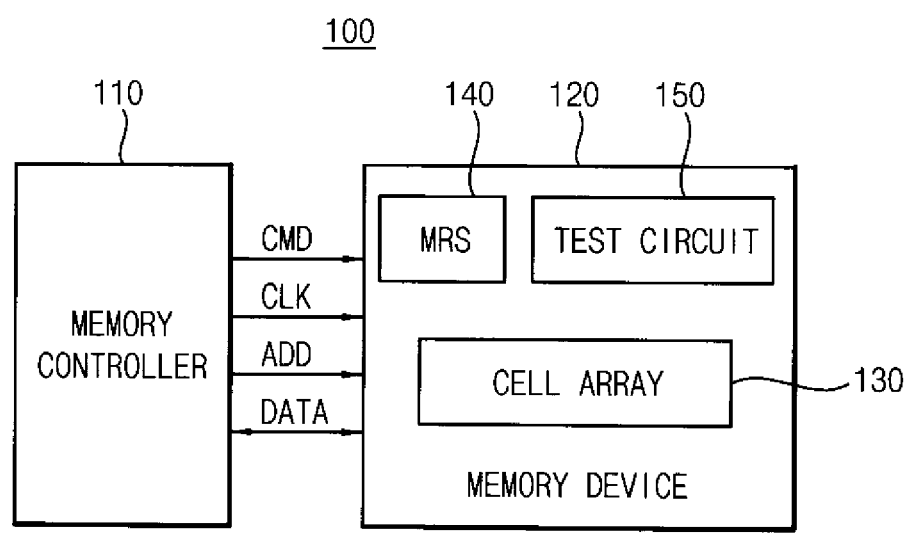
FIG. 1 is a block diagram illustrating a memory system according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. Unless indicated otherwise, these terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms such as "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a memory system according to example embodiments.

Referring to FIG. 1, a semiconductor memory system 100 includes a memory controller 110 and a semiconductor memory device 120. The memory controller 110 sends a command signal CMD, a clock signal CLK and an address signal ADD to the semiconductor memory device 120 and exchanges data with the semiconductor memory device 120.

The semiconductor memory device 120 includes a memory cell array 130, a mode register set (MRS) 140 and a test circuit 150. As will be described below with reference to FIGS. 3 through 10, the memory cell array 130 may include a plurality of wordlines, a plurality of bitlines, and a plurality of spin-transfer torque magneto-resistive random access memory (STT-MRAM) cells. Each STT-MRAM cell disposed in a cross area of each wordline and bitline, and the STT-MRAM cell includes a magnetic tunnel junction (MTJ) element and a cell transistor, and the MTJ element includes a free layer, a barrier layer and a pinned layer. A gate of the cell transistor is coupled to a wordline, a first electrode of the cell transistor is coupled to a bitline via the MTJ element, and a second electrode of the cell transistor is coupled to a source line.

The mode register set 140 sets a test mode. For example, the test mode may be set in the mode register set 140 based on an MRS command and mode setting data provided from the memory controller 110. The test mode set by the mode register set 140 may include at least one of a read leveling test mode for adjusting a skew between a clock signal and a data strobe signal as will be described below with reference to FIGS. 11 through 15, a parallel bit test mode for detecting failed cells among the STT-MRAM cells as will be described below with reference to FIGS. 16 through 20C, and a boundary scan test mode for detecting inner connection fail of the semiconductor memory device as will be described below with reference to FIGS. 21 through 23.

The test circuit 150 performs a test operation that is set by the mode register set 140. The test circuit 150 may have a configuration for performing the read leveling test, the parallel bit test and/or the boundary scan test. The test circuit 150 may be dispersed in respective portions of the semiconductor memory device 120 as will be described below.

The memory controller 110 may be configured to control the MRAM. For example, the memory controller 110 may have a configuration identical or similar to a dynamic random access memory (DRAM) controller for controlling the DRAM. For example, the semiconductor memory system 100 may have an interface identical or similar to the DRAM interface.

Figure 2:
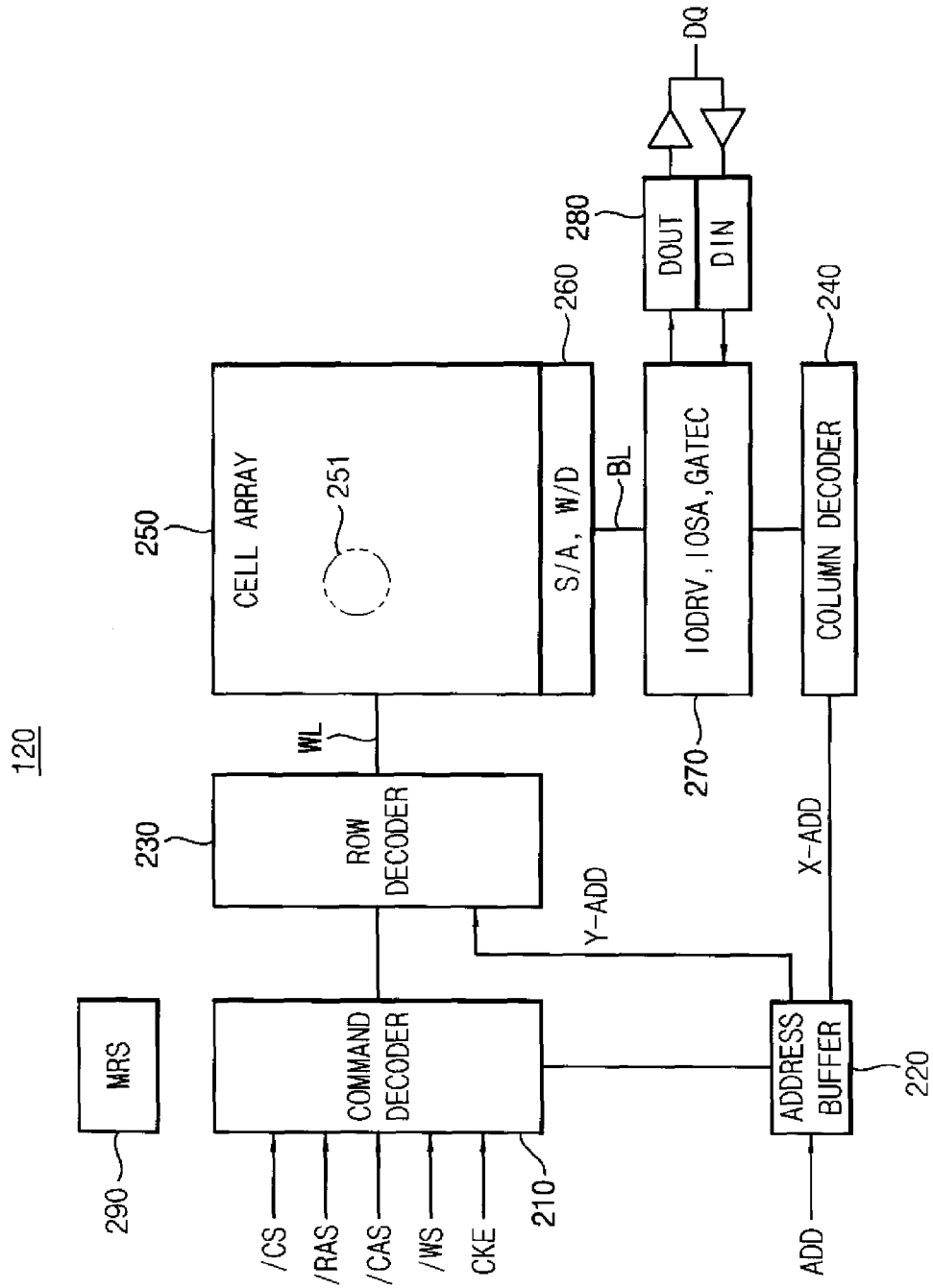
FIG. 2 is a block diagram illustrating a memory device according to example embodiments.

FIG. 2 is a block diagram illustrating a memory device according to example embodiments.

Referring to FIGS. 1 and 2, a semiconductor memory device 120 may include a command decoder 210, an address buffer 220, a row decoder 230, a column decoder 240, a memory cell array 250, a sense-amplifier/write-driver (S/A, W/D) circuit 260, an input-output driver circuit 270, a data input-output circuit 280 and a mode register set 290.

The mode register set 290 may set the semiconductor memory device 120 in a normal operation mode or in a test mode. The test mode may be one of the read leveling test mode, the parallel bit test mode and the boundary scan test mode.

The command decoder 210 receives the command CMD from an external device such as the memory controller 110 in FIG. 1 and performs a decoding operation on the received command. The command decoder 210 may perform the decoding operation based on a chip select signal /CS, a row address strobe signal /RAS, a column address strobe signal CAS/, a write enable signal /WE and a clock enable signal CKE. After the decoding operation is completed, the memory device 120 may be controlled to perform the command CMD from the memory controller 110.

The address signal ADD from the memory controller 110 is stored in the address buffer 220. The address buffer 220 provides a row address Y-ADD to the row decoder and a column address X-ADD to the column decoder 240.

The row decoder 230 and the column decoder 240 include a plurality of switches, respectively. The row decoder 230 performs a switching operation in response to the row address Y-ADD to select a wordline WL and the column decoder 240 performs a switching operation in response to the column address X-ADD to select a bitline BL. The memory cell array 250 includes a plurality of memory cells. The memory cell 251, which is disposed in the cross area of the wordline WL and the bitline BL, may be selected to write or read data.

The memory cell 251 may be an STT-MRAM cell. The STT-MRAM cell 251 has characteristics of non-volatility and has a relatively small or great resistance value depending on the written data.

In a read operation, a data voltage corresponding to the resistance value of the memory cell 251 is provided to the sense-amplifier/write-driver circuit 260. The sense-amplifier/write-driver circuit 260 includes a plurality of sense amplifier circuits for sensing and amplifying the data voltage to output a digital signal corresponding to the data voltage. The signals from the sense-amplifier/write-driver circuit 260 are transferred to the data input-output circuit 280 via the input-output driver circuit 270. The input-output driver circuit 270 may include an input-output driver IODRV, an input-output sense amplifier IOSA and a gating circuit GATEC. The data input-output circuit 280 may include an output buffer DOUT and an input buffer DIN. The data input-output circuit 280 output the transferred data DQ to the memory controller 110.

Figure 3:
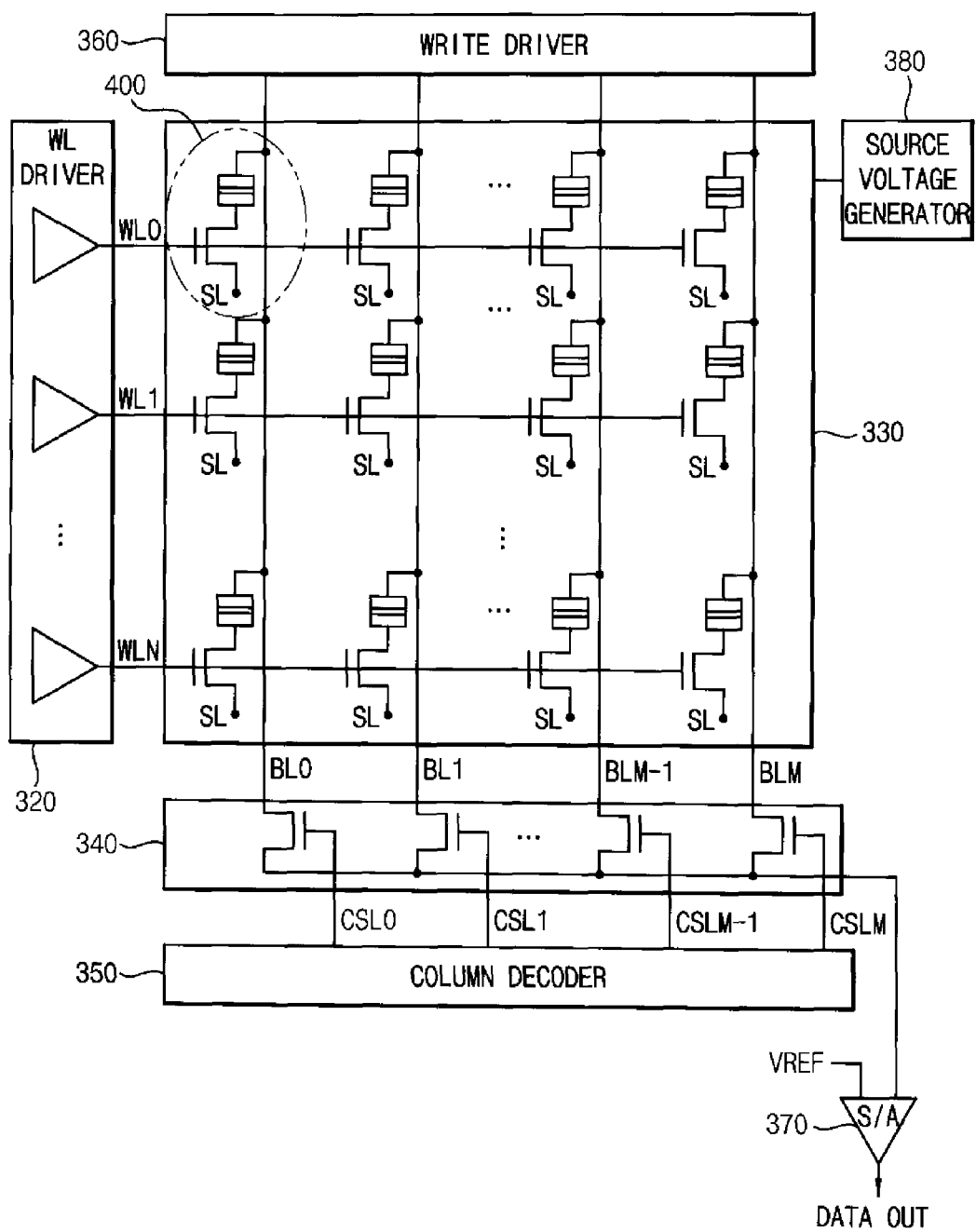
FIG. 3 is a circuit diagram illustrating an example of a memory cell array in the memory device of FIG. 2 according to example embodiments.

FIG. 3 is a circuit diagram illustrating an example of a memory cell array in the memory device of FIG. 2 according to example embodiments.

Referring to FIG. 3, a memory cell array 330 includes a plurality of wordlines WL0~WLN, a plurality of bitlines BL0~BLM and a plurality of memory cells 400 respectively disposed in cross areas of the wordlines WL0~WLN and the bitlines BL0~BLM. When the memory cell 400 is implemented with an STT-MRAM cell, each memory cell 400 may include a magnetic tunnel junction (MTJ) element of magnetic materials.

The memory cell 400 may include a cell transistor and the MTJ element. The cell transistor is turned on or off in response to a signal driven by a wordline driver 320. The wordline driver 320 outputs wordline voltages to select one of the wordlines WL0~WLN. The wordline driver 320 may include a means for decoding the row address, or the decoded address may be provided to the wordline driver 320 from the row decoder 230 in FIG. 2. The cell transistor and the MTJ element in each memory cell 400 are coupled between a source line SL and one of the bitlines BL0~BLM. Even though not illustrated in FIG. 3, a plurality of memory cells may be coupled to the common source line. In some embodiments, the memory cell array 330 may be partitioned to at least two cell regions and the cell regions may be coupled to the different source lines.

In some example embodiments, the MTJ element may be replaced with, for example, phase-change random access memory (PRAM) using phase-change materials, resistance random access memory (RRAM) using complex metal oxide of variable resistance, ferroelectrics random access memory (FRAM) using ferroelectric materials and magneto-resistive random access memory (MRAM) using ferromagnetic materials. Such resistive memories have the resistance value depending on the magnitude and/or the direction of the applied current or voltage and have characteristics of non-volatility of maintaining the resistance value even though power is off.

The bitlines BL0~BLM are coupled to a write driver 360. The write driver 360 may perform a write operation by applying currents or voltages to the memory cells in response to an external command.

The column decoder 350 generates column select signals CSL0~CSLM to select one of the bitlines BL0~BLM. For example, a switching circuit 340 including switches coupled to the bitlines BL0~BLM may be implemented and the column select signals CSL0~CSLM may be provided to the switching circuit 340. In the read operation, the data voltage depending on the resistance value of the memory cell 400 is transferred to the sense amplifier 370 via the corresponding bitline. The sense amplifier 370 senses and amplifies the difference between the data voltage and a reference voltage VREF to output a digital signal. The source voltage generator 380 is coupled to the source line SL and provides voltages for the read operation or the write operation.

Figure 4:
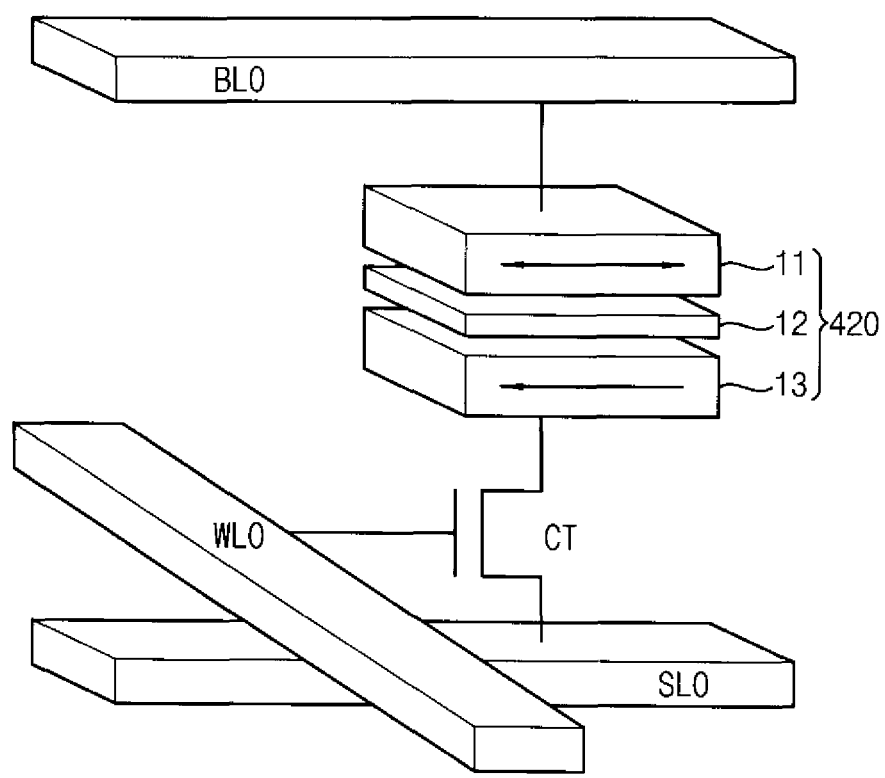
FIG. 4 is a diagram illustrating an example of a spin-transfer torque magneto-resistive random access memory (STT-MRAM) cell in the memory cell array of FIG. 3.

FIG. 4 is a diagram illustrating an example of a spin-transfer torque magneto-resistive random access memory (STT-MRAM) cell in the memory cell array of FIG. 3.

Referring to FIG. 4, the STT-MRAM cell may include an MTJ element 420 and a cell transistor CT. A gate of the cell transistor CT is coupled to a corresponding wordline WL0, a first electrode of the cell transistor CT is coupled to a corresponding bitline BL0 via the MTJ element 420, and a second electrode of the cell transistor CT is coupled to a source line SL0.

The MTJ element may include a pinned layer 13, a free layer 11 and a barrier layer 12 between the two layers 11 and 13. The magnetization direction of the pinned layer 13 is fixed but the magnetization direction of the free layer 11 may be varied, according to the written data, between the same direction as or opposite direction to the magnetization direction of the pinned layer 13. In one embodiment, an anti-ferromagnetic layer may be further included in the MTJ element to enforce the magnetization direction of the pinned layer 13.

For example, to perform the read operation of the STT-MRAM cell, a high level voltage is applied to the wordline WL0 to turn on the cell transistor CT, a read current is applied to flow from the bitline BL0 to the source line SL0, and the resistance value is measured to determine the data stored in the MTJ element 420.

Figure 5A:
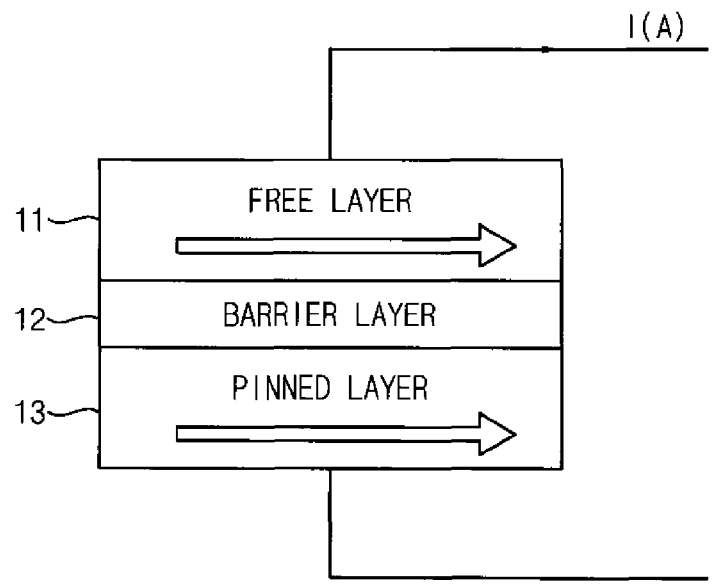
FIGS. 5A and 5B are exemplary diagrams illustrating magnetization directions of a magnetic tunnel junction (MTJ) element depending on written data.
Figure 5B:
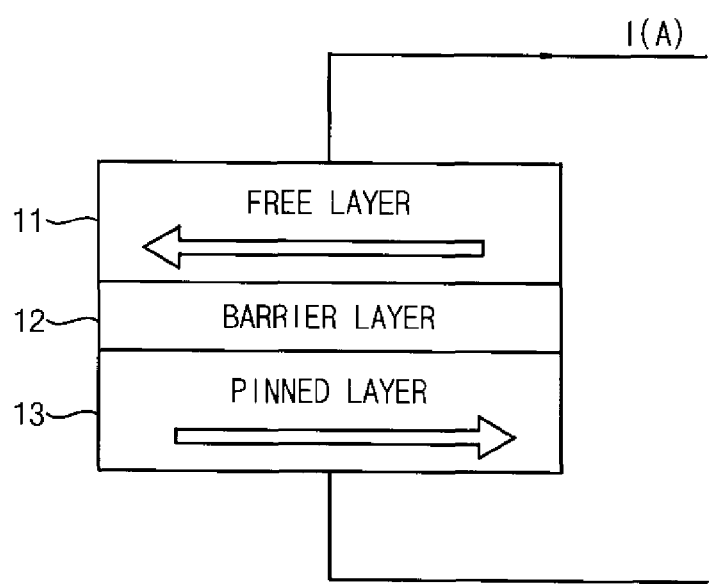

FIGS. 5A and 5B are exemplary diagrams illustrating magnetization directions of a magnetic tunnel junction (MTJ) element depending on written data.

FIGS. 5A and 5B illustrates the magnetization directions of an MTJ element and an example read operation. The resistance value of the MTJ element may be changed the magnetization direction of the free layer 11. When the read current I(A) is applied to the MTJ element, the data voltage depending on the resistance value of the MTJ element is output. The magnitude of the read current I(A) is much smaller than the magnitude of a write current and thus the magnetization direction of the free layer is not changed due to the read current I(A).

Referring to FIG. 5A, the magnetization direction of the free layer 11 may be arranged parallel with the magnetization direction of the pinned layer 13. In this case, the MTJ element has a relatively smaller resistance value and the data '0' may be read out by applying the read current I(A).

Referring to FIG. 5B, the magnetization direction of the free layer 11 may be arranged opposite to the magnetization direction of the pinned layer 13. In this case, the MTJ element has a relatively greater resistance value and the data '1' may be read out by applying the read current I(A).

Even though the free layer 11 and the pinned layer 13 having the horizontal magnetization are illustrated in FIGS. 5A and 5B, the MTJ element may be implemented such that the free layer 11 and the pinned layer 13 have the vertical magnetization.

Figure 6:
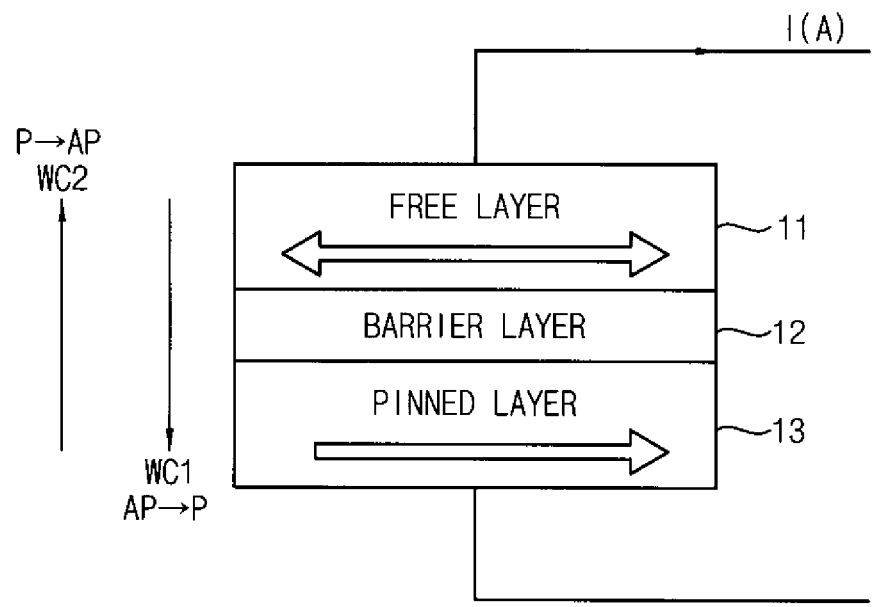
FIG. 6 is an exemplary diagram illustrating a write operation of STT-MRAM cell.

FIG. 6 is an exemplary diagram illustrating a write operation of STT-MRAM cell.

The magnetization direction of the free layer 11 may be determined depending on the write currents WC1 and WC2. For example, when the first write current WC1 is applied to the MTJ element, the free electrons having the same spin direction as the pinned layer 13 apply a torque to the free layer 11 and thus the free layer 11 is magnetized in the same direction as, that is, parallel direction (P) with the pinned layer 13. When the second write current WC2 is applied to the MTJ element, the free electrons having the opposite spin direction to the pinned layer 13 apply a torque to the free layer 11 and thus the free layer 11 is magnetized in the opposite direction as, that is, anti-parallel direction (AP) with the pinned layer 13. As such the magnetization direction of the free layer 11 in the MTJ element may be changed by the spin transfer torque (STT).

Figure 7A:
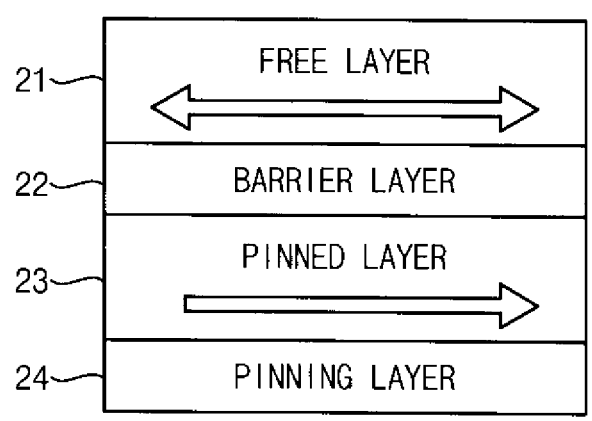
FIGS. 7A, 7B, 8, 9 and 10 are diagrams illustrating examples of the MTJ element in the STT-MRAM cell.
Figure 7B:
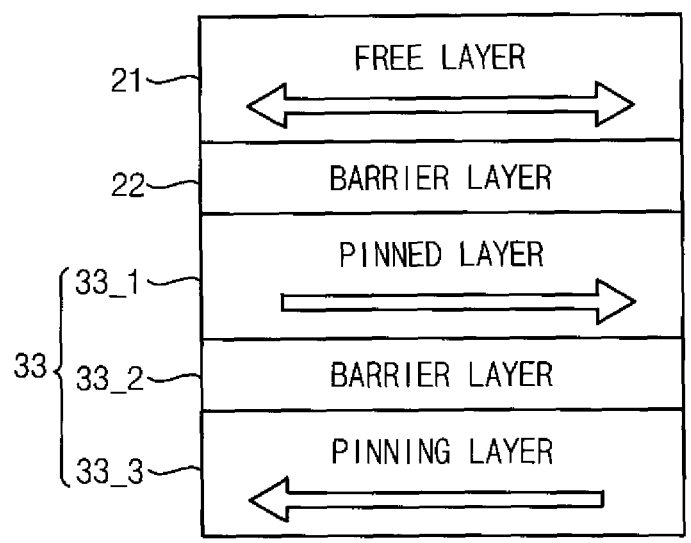

FIGS. 7A and 7B are diagrams illustrating examples of the MTJ element in the STT-MRAM cell. An MTJ element having the horizontal magnetization corresponds to a case that the direction of an applied current is perpendicular to the easy-magnetization axis.

Referring to FIG. 7A, an MTJ element 20 may include a free layer 21, a barrier layer 22, a pinned layer 23 and a pinning layer 24.

The free layer 21 may include materials having a variable magnetization direction. The magnetization direction of the free layer 21 may be varied depending on internal and/or external electrical and/or magnetic factors. The free layer 21 may be implemented with ferromagnetic materials including at least one of cobalt (Co), iron (Fe) and nickel (Ni). For example, the free layer 21 may include at least one of FeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO and Y3Fe5O12.

The barrier layer 22 may have a width shorter than a spin diffusion distance. The barrier layer 22 may be implemented with non-magnetic materials. For example, the barrier layer 22 may include at least one of Mg, Ti, Al, an oxide of MgZn or MgB, and a nitride of Ti or V.

The pinned layer 23 may have the magnetization direction that is fixed by the pinning layer 24. The pinned layer 23 may be implemented with ferromagnetic materials. For example, the pinned layer 23 may include at least one of FeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO and Y3Fe5O12.

The pinning layer 24 may be implemented with anti-ferromagnetic materials. For example, the pinning layer 24 may include at least one of PtMn, IrMn, MnO, MnS, MnTe, MnF2, FeCl2, FeO, CoCl2, CoO, NiCl2, NiO and Cr.

When the free layer and the pinned layer are implemented with ferromagnetic materials, a stray field may be generated in edge portions of the ferromagnetic materials. The stray field may decrease magneto-resistance or increase the resistive magnetism in the free layer, thereby causing asymmetric switching. Thus the MTJ element may require structure for reducing or controlling the stray field due to the ferromagnetic materials.

Referring to FIG. 7B, a fixed layer 33 in an MTJ element 30 may be implemented with synthetic anti-ferromagnetic (SAF). The fixed layer 33 may include a pinned layer 33_1, a barrier layer 33_2 and a pinning layer 33_3. Each of the pinned layer 33_1 and the pinning layer 33_3 may include at least one of CoFeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO and Y3Fe5O12. The magnetization directions of the pinned layer 33_1 and the pinning layer 33_3 may be different from each other and the magnetization directions of the pinned layer 33_1 and the pinning layer 33_3 may be fixed, respectively. The barrier layer 33_2 may include Ru.

Figure 8:
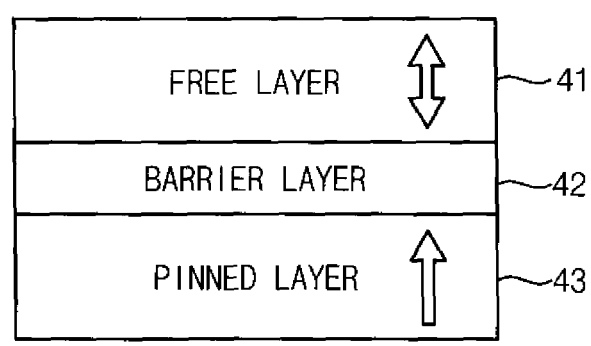

FIG. 8 is a diagram illustrating an example of the MTJ element in the STT-MRAM cell. An MTJ element having the vertical magnetization corresponds to a case that the direction of an applied current is parallel with the easy-magnetization axis.

The MTJ element 40 has a relatively smaller resistance when the magnetization direction of the free layer 41 is parallel with the magnetization direction of the pinned layer 43, and the MTJ element 40 has a relatively greater resistance when the magnetization direction of the free layer 41 is opposite to the magnetization direction of the pinned layer 43. The data may be stored as the resistance value.

For example, to implement the MTJ element 40 having the vertical magnetization, the free layer 41 and the pinned layer 43 may be implemented with materials having higher magnetic anisotropic energy such as alloys of amorphous rare-earth elements, multilayer thin films as (Co/Pt)n and (Fe/Pt)n, superlattice materials of L10 crystalline structure. The free layer 41 may be an ordered alloy including at least one of Fe, Co, Ni, Pa and Pt. For example, the free layer 41 may include at least one of Fe—Pt alloy, Fe—Pd alloy, Co—Pd alloy, Co—Pt alloy, Fe—Ni—Pt alloy, Co—Fe—Pt alloy, and Co—Ni—Pt alloy. Such alloys may be, quantochemically, Fe50Pt50, Fe50Pd50, Co50Pd50, Co50Pt50, Fe30Ni20Pt50, Co30Fe20Pt50, or Co30Ni20Pt50.

The pinned layer 43 may be an ordered alloy including at least one of Fe, Co, Ni, Pa and Pt. For example, the pinned layer 43 may include at least one of Fe—Pt alloy, Fe—Pd alloy, Co—Pd alloy, Co—Pt alloy, Fe—Ni—Pt alloy, Co—Fe—Pt alloy, and Co—Ni—Pt alloy. Such alloys may be, quantochemically, Fe50Pt50, Fe50Pd50, Co50Pd50, Co50Pt50, Fe30Ni20Pt50, Co30Fe20Pt50, or Co30Ni20Pt50.

Figure 9:
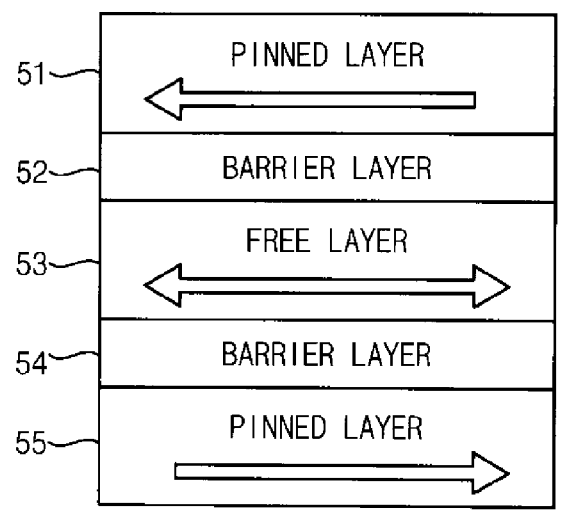
Figure 10:
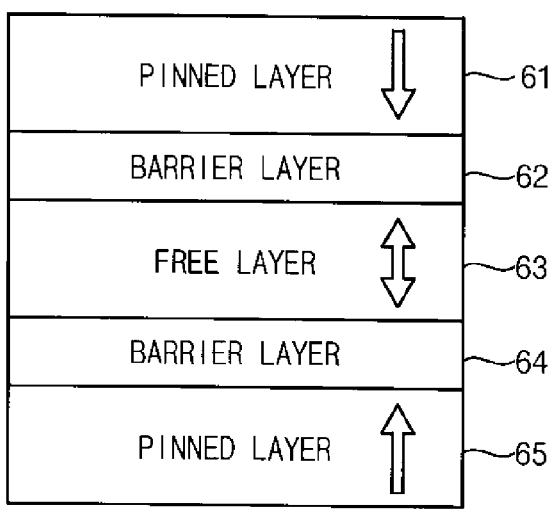

FIGS. 9 and 10 are diagrams illustrating examples of the MTJ element in the STT-MRAM cell. A dual MTJ element has a structure that two pinned layers and two barrier layers centered on a free layer.

Referring to FIG. 9, a dual MTJ element 50 forming horizontal magnetization may include a first barrier layer 51, a first barrier layer 52, a free layer 53, a second barrier layer 54 and a second pinned layer 55. The materials forming the respective layers may be the same as or similar to the materials of the free layer 21, the barrier layer 22 and the pinned layer 23 in FIG. 7A.

In one embodiment, when the magnetization direction of the first pinned layer 51 is fixed in the opposite direction to the magnetization direction of the second pinned layer 55, the magnetic fields due to the first and second pinned layers 51 and 55 may be interfered destructively. Accordingly, data may be written in the dual MTJ element 50 using the smaller write current than the single MTJ element. Also the exact data may be read from the dual MTJ element 50 because the MTJ element 50 provides the greater resistance value due to the second barrier layer 54.

Referring to FIG. 10, a dual MTJ element 60 forming vertical magnetization may include a first barrier layer 61, a first barrier layer 62, a free layer 63, a second barrier layer 64 and a second pinned layer 65. The materials forming the respective layers may be the same as or similar to the materials of the free layer 41, the barrier layer 42 and the pinned layer 43 in FIG. 8.

In one embodiment, when the magnetization direction of the first pinned layer 61 is fixed in the opposite direction to the magnetization direction of the second pinned layer 65, the magnetic fields due to the first and second pinned layers 61 and 65 may be interfered destructively. Accordingly, data may be written in the dual MTJ element 60 using the smaller write current than the single MTJ element.

Hereinafter, a read leveling test operation using a pattern storage circuit or a multi-purpose register (MPR) according to an example embodiment is described with reference to FIGS. 11 through 15. The read leveling test may be performed to detect and adjust a skew between a clock signal and a data strobe signal by sending a data pattern, which is defined and stored in a memory chip, to a memory controller.

Figure 11:
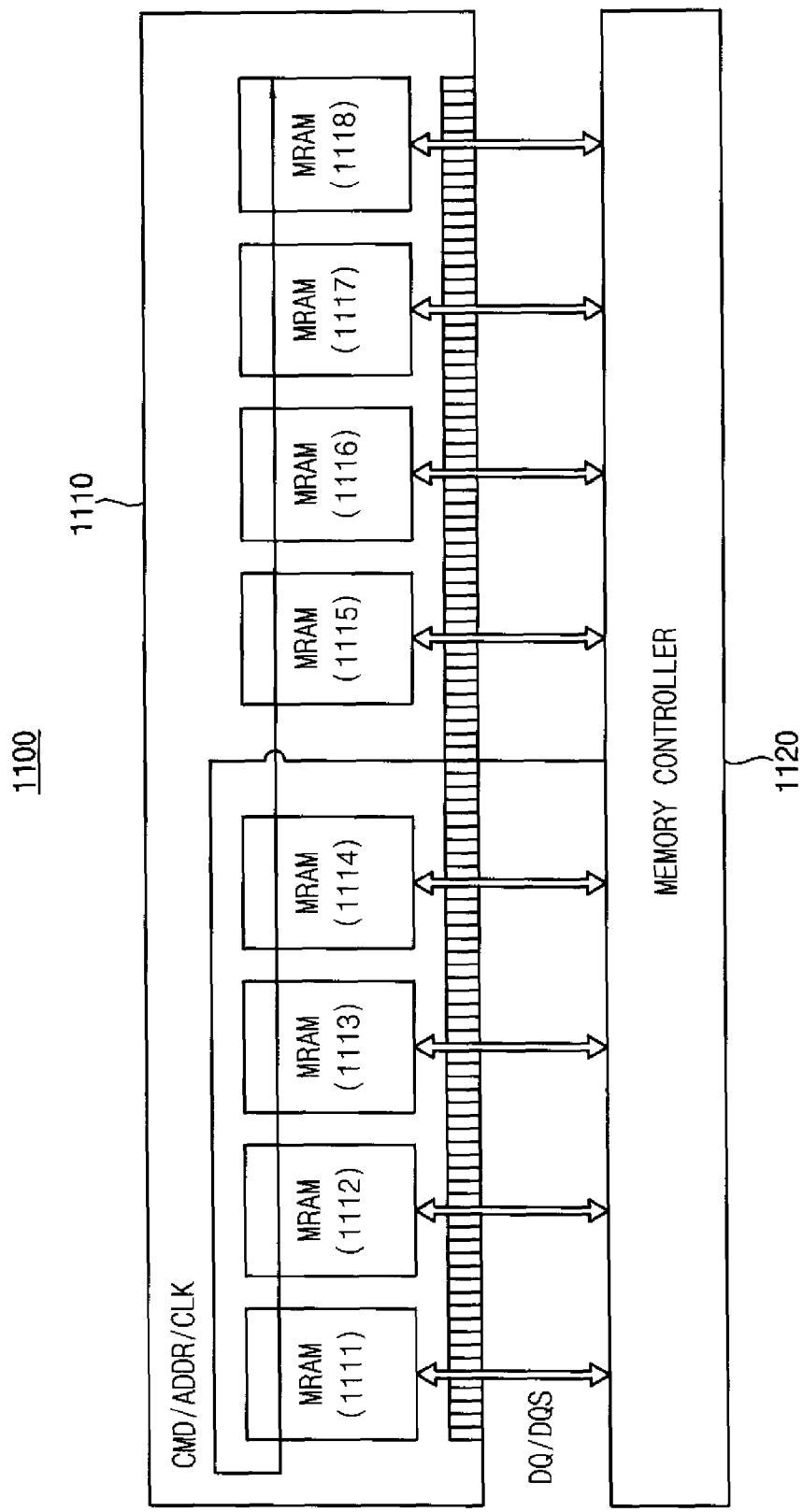
FIG. 11 is a block diagram illustrating a memory system according to example embodiments.

FIG. 11 is a block diagram illustrating a memory system according to example embodiments.

Referring to FIG. 11, a memory system 1100 includes a memory module 1110 and a memory controller 1120. The memory module 1110 may have a configuration of an unbuffered memory module. The memory module 1110 includes a plurality of memory chips 1111 through 1118, and each of the memory chips 1111 through 1118 may be a magneto-resistive random access memory (MRAM) disclosed herein.

In some exemplary embodiments, each of the memory chips and/or the memory controller 1120 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The memory controller 1120 sends a command CMD, an address signal ADDR, a clock signal CLK, data DQ and a data strobe signal DQS to the memory chips 1111 through 1118. The command CMD, the address signal ADDR and the clock signal CLK may be transferred sequentially from the first memory chip 1111 to the last memory chip 1118. The data DQ and the data strobe signal DQS may be one-to-one transferred to the respective memory chips 1111 through 1118. Thus the memory system 1100 require the read leveling test for adjusting the skew between the clock signal CLK and the data strobe signal DQS received by the respective memory chip.

Figure 12:
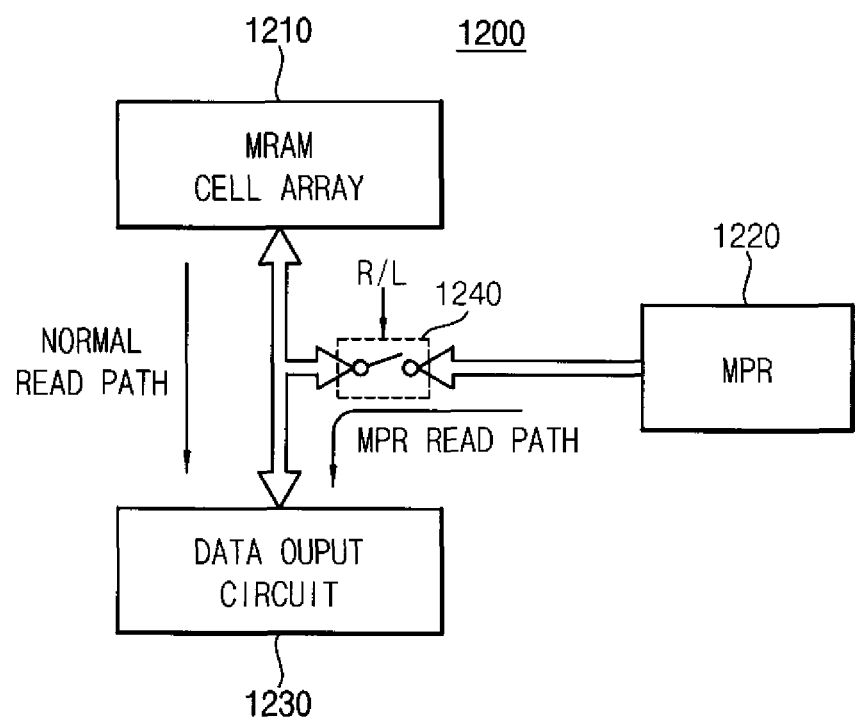
FIG. 12 is a diagram illustrating a read leveling test operation according to an example embodiment.

FIG. 12 is a diagram illustrating a read leveling test operation according to an example embodiment. For the read leveling test operation, the semiconductor device 1200 may perform a multi-purpose register (MPR) read operation in which the data pattern stored in the pattern storage circuit (e.g., MPR) 1220 is output, instead of a normal read operation in which the data stored in the memory cell array 1210 are output.

Referring to FIG. 12, the semiconductor device 1200 may perform the normal read operation through the normal read path and the MPR read operation through the MPR read path. The MPR read path may be selectively enabled by a selection switch 1240 in response to a read leveling signal R/L. In the normal read operation, the semiconductor device 1200 reads out the data stored in MRAM cells of the cell array and transfers the read data to a data output circuit 1230. When the read leveling signal R/L is activated, the selection switch 1240 enables the MPR read path and the semiconductor device 1200 performs the MPR read for transferring the data pattern from the pattern storage circuit 1220 to the data output circuit 1230.

Figure 13:
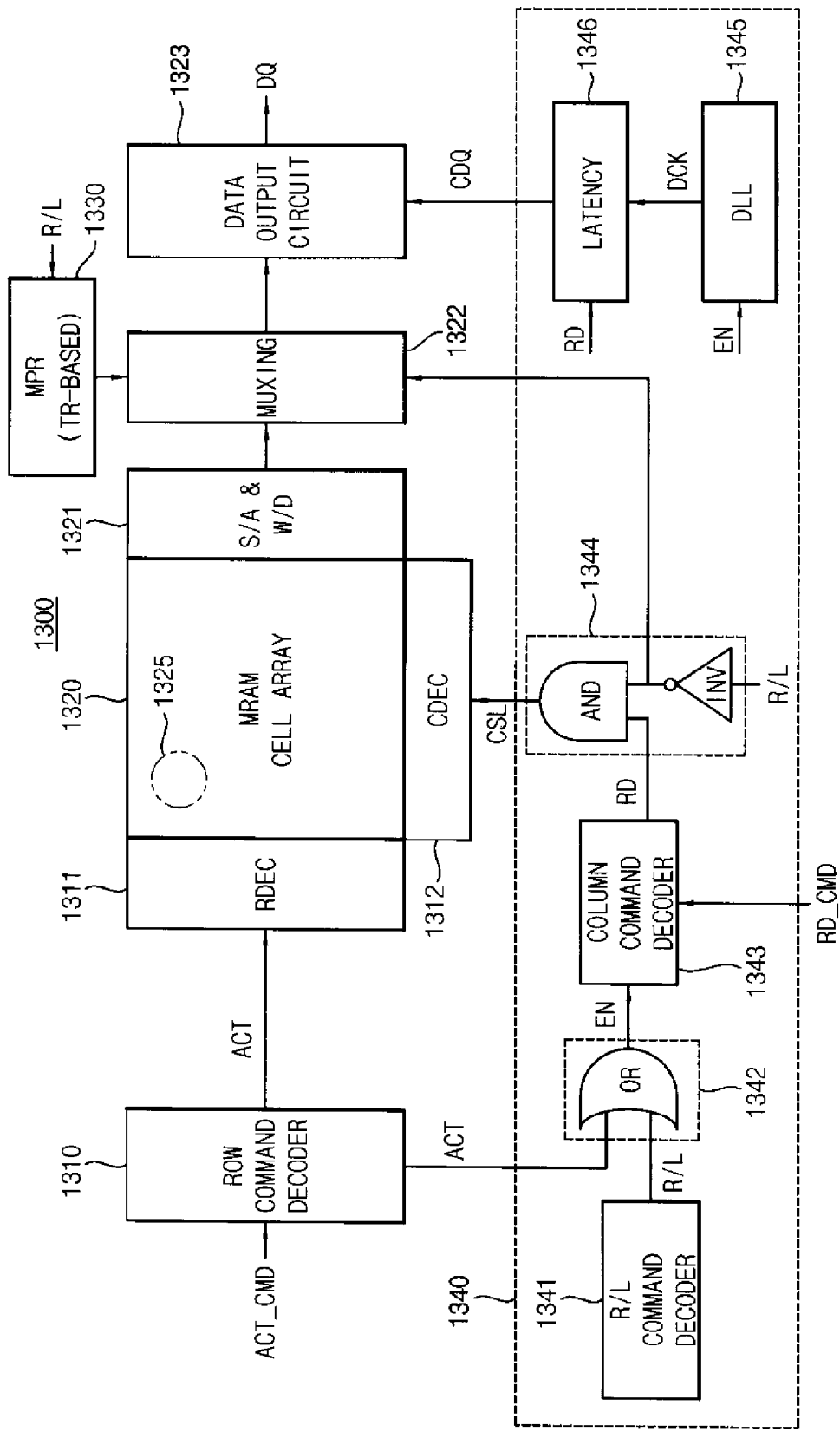
FIG. 13 is a block diagram illustrating a memory device according to an example embodiment.
Figure 14:
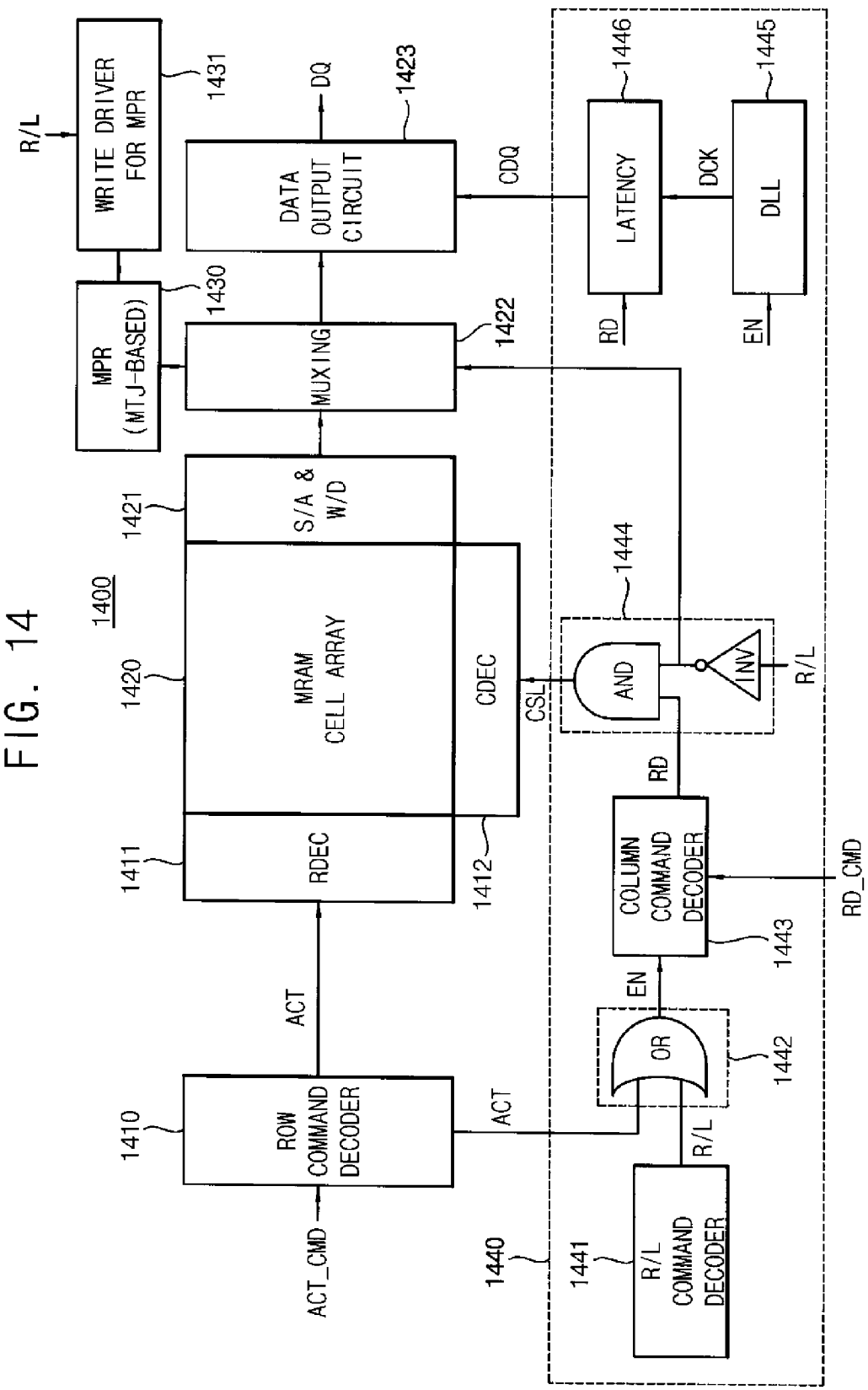
FIG. 14 is a block diagram illustrating a memory device according to another example embodiment.
Figure 15:
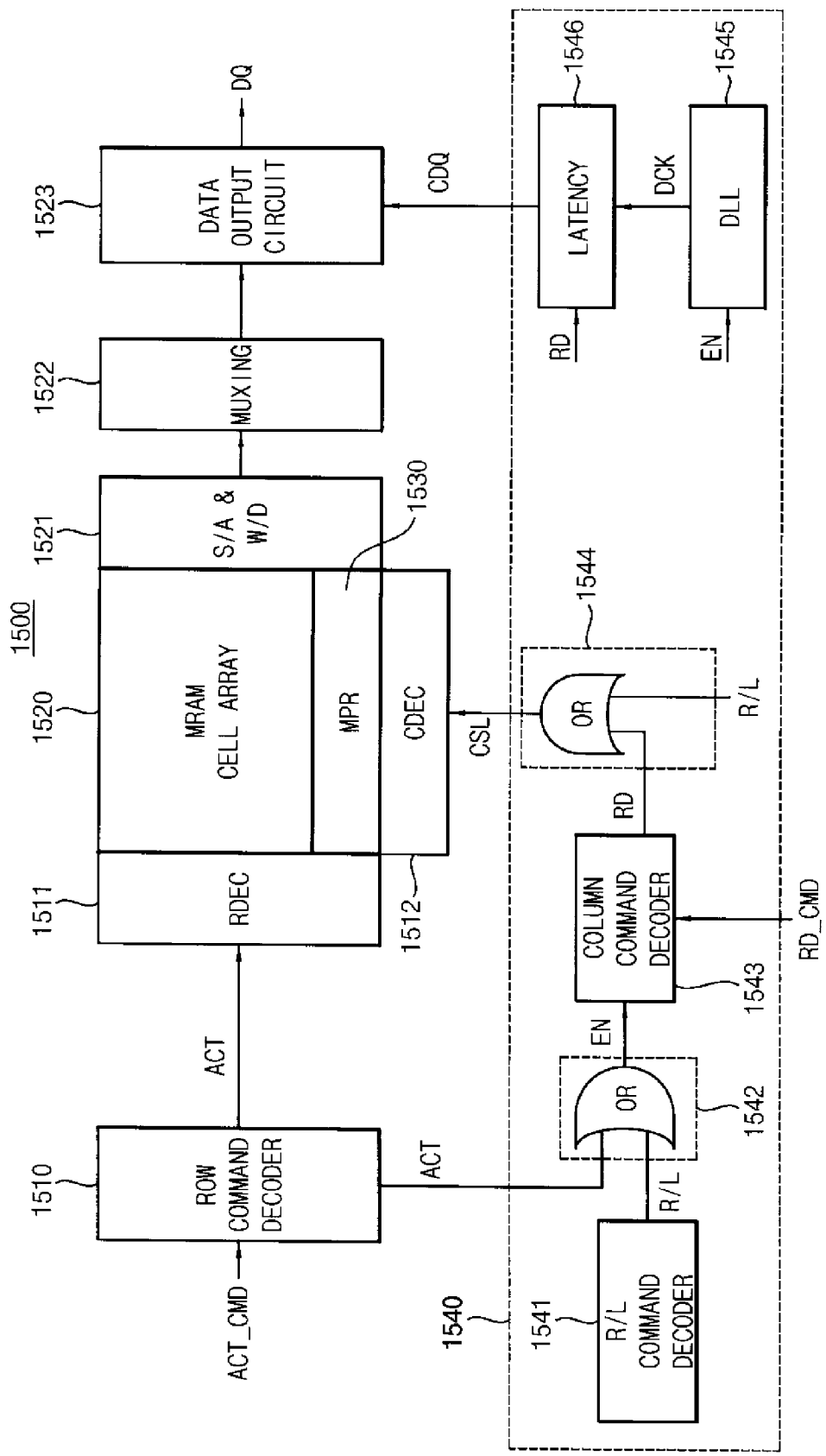
FIG. 15 is a block diagram illustrating a memory device according to still another example embodiment.

FIGS. 13, 14 and 15 are diagrams illustrating a memory device according to example embodiments.

FIG. 13 illustrates a first embodiment of a semiconductor memory device configured to perform the read leveling test operation. Referring to FIG. 13, the semiconductor memory device 1300 may include a row command decoder 1310, a row decoder 1311, a column decoder 1312, a memory cell array 1320, a sense-amplifier/write-driver 1321, a selection circuit 1322, a data output circuit 1323, a pattern storage circuit (MPR) 1330 and an output control circuit 1340.

The row command decoder 1310 generates an active signal ACT by decoding an active command ACT_CMD in the normal read operation. The active command ACT_CMD may be a combination of a chip select signal /CS, a row address strobe signal /RAS, a column address strobe signal /CAS, a write enable signal /WE and a clock enable signal CKE.

In the normal read operation, the row decoder 1311 drives a selected wordline WL in response to the active signal ACT. The column decoder 1312 drives a selected bitline BL in response to a column selection signal CSL. In addition, the row decoder 1311 may drive a selected wordline WL in response to row address signals and the column decoder 1312 may drive a selected bitline BL in response to column address signals.

The memory cell array 1320 may include a MRAM cell 1325, which is disposed in the cross area of the selected wordline WL and the selected bitline BL. As described above, the MRAM cell 1325 is a resistive memory cell having non-volatility and the MRAM cell 1325 may have the relatively smaller or greater resistance value depending on the written data.

In a read operation, a voltage corresponding to the resistance value of the MRAM cell 1325 is provided to the sense-amplifier/write-driver 1321. The sense-amplifier/write-driver 1321 outputs a digital signal based on the voltage.

The pattern storage circuit 1330 stores the predetermined data pattern for the read leveling test operation. In an example embodiment, the pattern storage circuit 1330 may be implemented with a register (TR). In one embodiment, the pattern storage circuit 1330 may be spaced apart from the memory cell array 1320 as shown in FIG. 13.

The selection circuit 1322 may select the data to be output according to an operation mode. The operation mode may be determined by the read leveling signal R/L. The selection circuit 1322 outputs the normal data stored in the memory cell array 1320 to the data output circuit 1323 in the normal read operation and outputs the data pattern stored in the pattern storage circuit 1330 to the data output circuit 1323 in the read leveling test operation. The data output circuit 1323 outputs the data selected by the selection circuit 1322 to an external device (e.g., a memory controller).

The output control circuit 1340 controls the memory cell array 1320 to output the data of the memory cell array 1320 in the normal read operation. In the read leveling test operation, the output control circuit 1340 blocks an access to the memory cell array 1320 and controls the selection circuit 1322. Also, the output control circuit 1340 controls the data output circuit 1323 to adjust an output latency of the data pattern provided from the pattern storage circuit 1330.

The output control circuit 1340 may include a read leveling command decoder 1341, a first logic gate 1342, a column command decoder 1343, a second logic gate 1344, a delay-locked loop (DLL) 1345 and a latency circuit 1346.

For example, the read leveling command decoder 1341 may generate the read leveling signal R/L based on the values stored in the mode register set MRS as described with reference to FIG. 2. The read leveling command decoder 1341 may include a mode register set in which different values are set depending on the operation mode. The read leveling signal R/L may be provided to the first logic gate 1342, the second logic gate 1344 and the pattern storage circuit 1330, respectively.

The first logic gate 1342 may generate an enable signal EN by performing an OR logic operation on the active signal ACT and the read leveling signal R/L. The active signal ACT is may be activated in the normal read operation and the read leveling signal R/L may be activated in the read leveling test operation. The enable signal EN from the first logic gate 1342 may be provided to the column command decoder 1343 and the delay-locked loop 1345. Accordingly the delay-locked loop 1345 may be enabled regardless of an active command ACT_CMD in the read leveling test mode to control the output latency.

The column command decoder 1343 decodes a read command RD_CMD in response to the enable signal EN to generate a read signal RD. The read command RD_CMD may be a combination of the chip select signal /CS, the row address strobe signal /RAS, the column address strobe signal /CAS and the write enable signal /WE. The read signal RD may be provided to the second logic gate 1344 and the latency circuit 1346.

The second logic gate 1344 may include an inverter INV and an AND gate. The inverter INV outputs an inversion signal of the read leveling signal R/L. The AND gate receives the read signal RD and the output of the inverter INV. The second logic gate 1344 may activate the column select signal CSL in the normal read operation and deactivates the column select signal CSL in the read leveling test operation.

The delay-locked loop 1345 may generate a clock signal DCK in response to the enable signal EN. The latency circuit 1346 may generate a control signal CDQ for controlling the output latency of the signal selected from the selection circuit 1322 in response to the clock signal DCK and the read signal RD. The control signal CDQ may be provided to the data output circuit 1323.

Accordingly the semiconductor memory device 1300 may reduce power consumption by blocking the access to the memory cell array 1320 in the read leveling test operation. In addition, the semiconductor memory device 1300 may control the output latency of the data pattern in the read leveling test operation by activating the enable signal EN regardless of the active command ACT_CMD to enable the delay-locked loop 1345.

FIG. 14 illustrates a second embodiment of a semiconductor memory device configured to perform the read leveling test operation. Referring to FIG. 14, the semiconductor memory device 1400 may include a row command decoder 1410, a row decoder 1411, a column decoder 1412, a memory cell array 1420, a sense-amplifier/write-driver 1421, a selection circuit 1422, a data output circuit 1423, a pattern storage circuit (MPR) 1430 and an output control circuit 1440.

The pattern storage circuit 1430 may be implemented with a plurality of STT-MRAM cells including the MTJ elements. In one embodiment, the semiconductor memory device 1400 may further include a write driver 1431 to drive the MRAM cells in the pattern storage circuit 1430.

The components in the semiconductor memory device 1400 of FIG. 14, except the write driver 1431, are the same as or similar to those of the semiconductor memory device 1300 of FIG. 13, and thus the detailed descriptions are omitted.

FIG. 15 illustrates a third embodiment of a semiconductor memory device configured to perform the read leveling test operation. Referring to FIG. 15, the semiconductor memory device 1500 may include a row command decoder 1510, a row decoder 1511, a column decoder 1512, a memory cell array 1520, a sense-amplifier/write-driver 1521, a selection circuit 1522, a data output circuit 1523, a pattern storage circuit (MPR) 1530 and an output control circuit 1540.

As illustrated in FIG. 15, the pattern storage circuit 1530 may be included in the memory cell array 1520 as a portion of the memory cell array 1520. For example, the additional write driver 1431 in FIG. 14 to drive the MRAM cells of the MPR 1530 is not required.

In the embodiments of FIGS. 13 and 14, the output control circuits 1340 and 1440 control the operation such that the access to the memory cell array is blocked and the data pattern is output from the pattern storage circuits 1330 and 1430 in the read leveling test operation. The pattern storage circuit 1530 in FIG. 15 is included in the memory cell array 1520 and thus the second logic gate 1544 may be implemented with an OR gate without including an inverter for inverting the read leveling signal R/L.

The components in the semiconductor memory device 1500 of FIG. 15, except a location of the pattern storage circuit 1530, are the same as or similar to those of the semiconductor memory device 1300 of FIG. 13, and thus the detailed descriptions are omitted.

Hereinafter, a parallel bit test operation according to an example embodiment is described with reference to FIGS. 16 through 20C. Failed memory cells in a semiconductor memory device have to be detected to realize exact read and write operations. As the semiconductor memory device is extremely integrated to include a few millions or more memory cells, reduction of the test time to detect the failed memory cells becomes a critical factor of increasing productivity. The parallel bit test may be used to reduce the test time.

Figure 16:
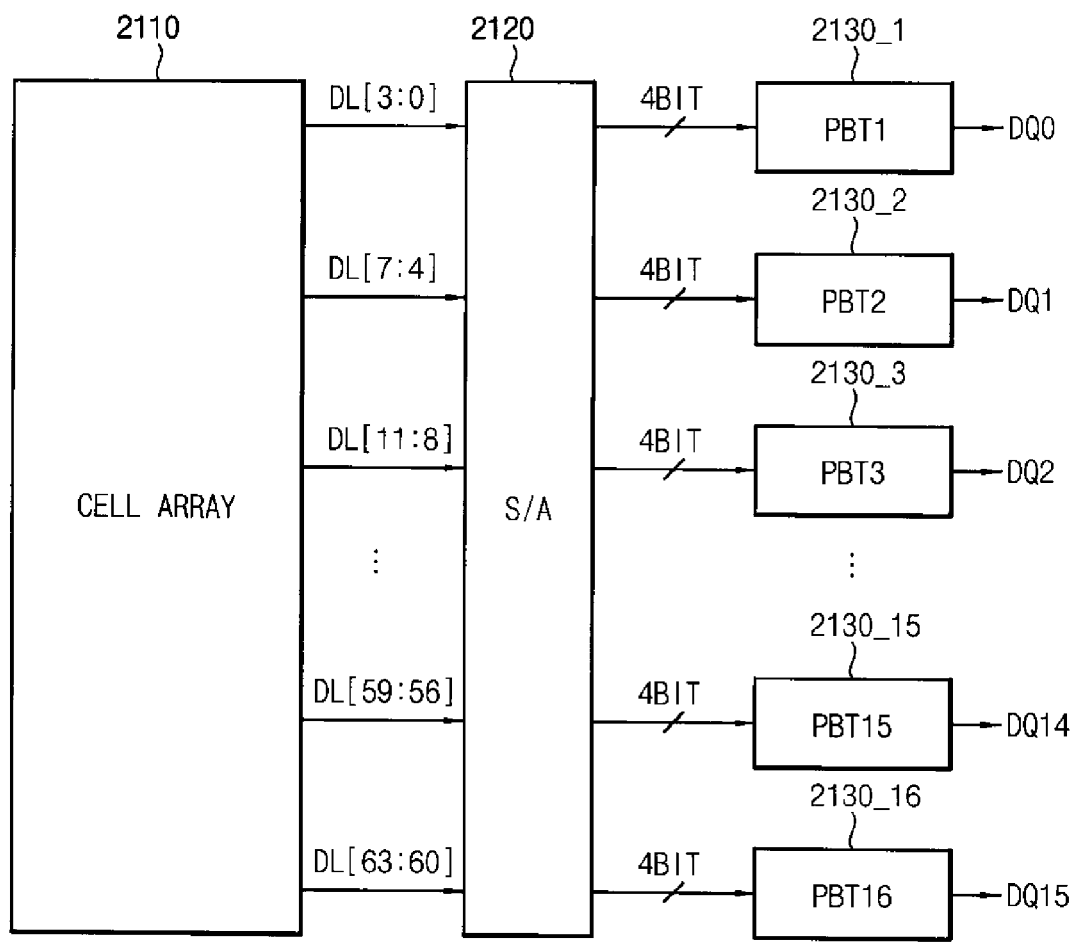
FIG. 16 is a diagram of a semiconductor memory device illustrating a parallel bit test operation according to an example embodiment.
Figure 17:
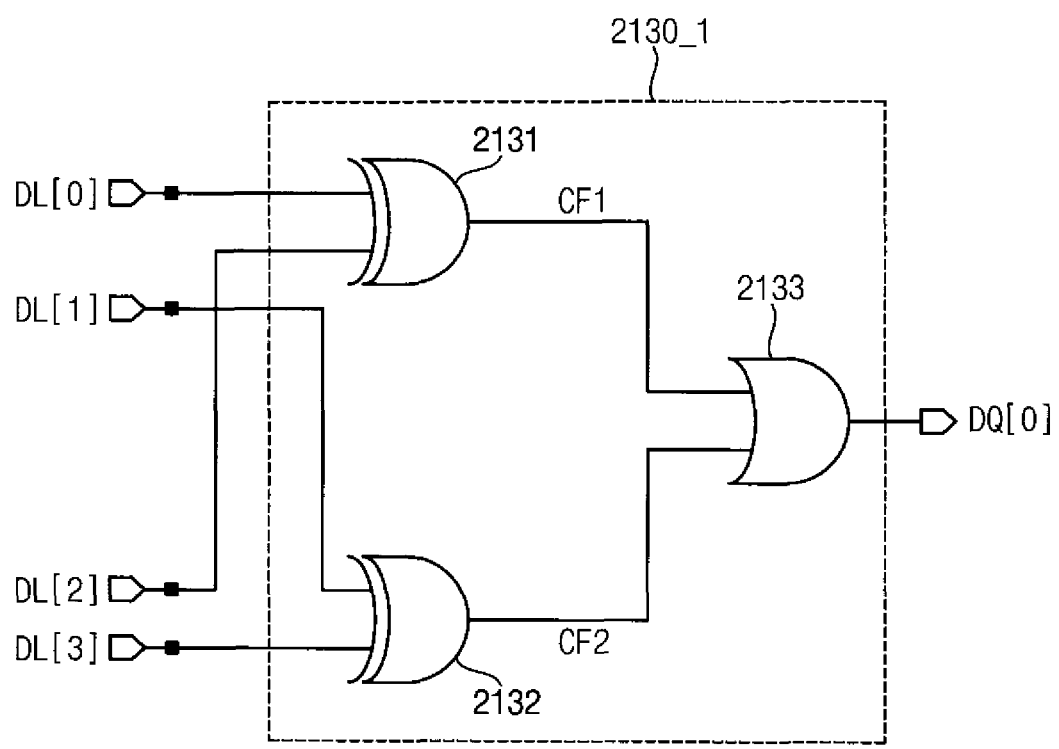
FIG. 17 is a circuit diagram illustrating an example of a parallel bit test circuit in the semiconductor memory device of FIG. 16.

FIG. 16 is a diagram of a semiconductor memory device illustrating a parallel bit test operation according to an example embodiment, and FIG. 17 is a circuit diagram illustrating an example of a parallel bit test circuit in the semiconductor memory device of FIG. 16.

Referring to FIG. 16, a semiconductor memory device 2100 includes a memory cell array 2110, a sense amplifier (S/A) 2120 and a plurality of parallel bit test circuits 2130_1 through 2130_16.

The memory cell array 2110 may include a plurality of MRAM cells and the MRAM cells may be coupled to data lines DL[63:0], respectively. For example, when one wordline is enabled, 4*16 data bits may be read out simultaneously. FIG. 16 illustrates an example where four data lines are coupled to each of the parallel bit test circuits 2130_1 through 2130_16 for convenience of description, the number of the data lines corresponding to the one parallel bit test circuit may be changed.

Referring to FIG. 17, the parallel bit test circuit 2130_1 may include a first exclusive-OR (XOR) gate 2131, a second XOR gate 2132 and an OR gate 2133. The first XOR gate 2131 receives data bits DL[0] and DL[2] and the second XOR gate 2132 receives data bits DL[1] and DL[3]. The XOR gates 2131 and 2132 perform XOR logic operations on the received data bits, respectively, to output comparison result data CF1 and CF2. The OR gate 2133 performs an OR logic operation on the comparison result data CF1 and CF2 to output test result data to an output pin DQ[0]. The other parallel bit test circuits 2130_2 through 2130_16 in FIG. 16 may have the same configuration as the parallel bit test circuit 2130_1 in FIG. 17.

Figure 18:
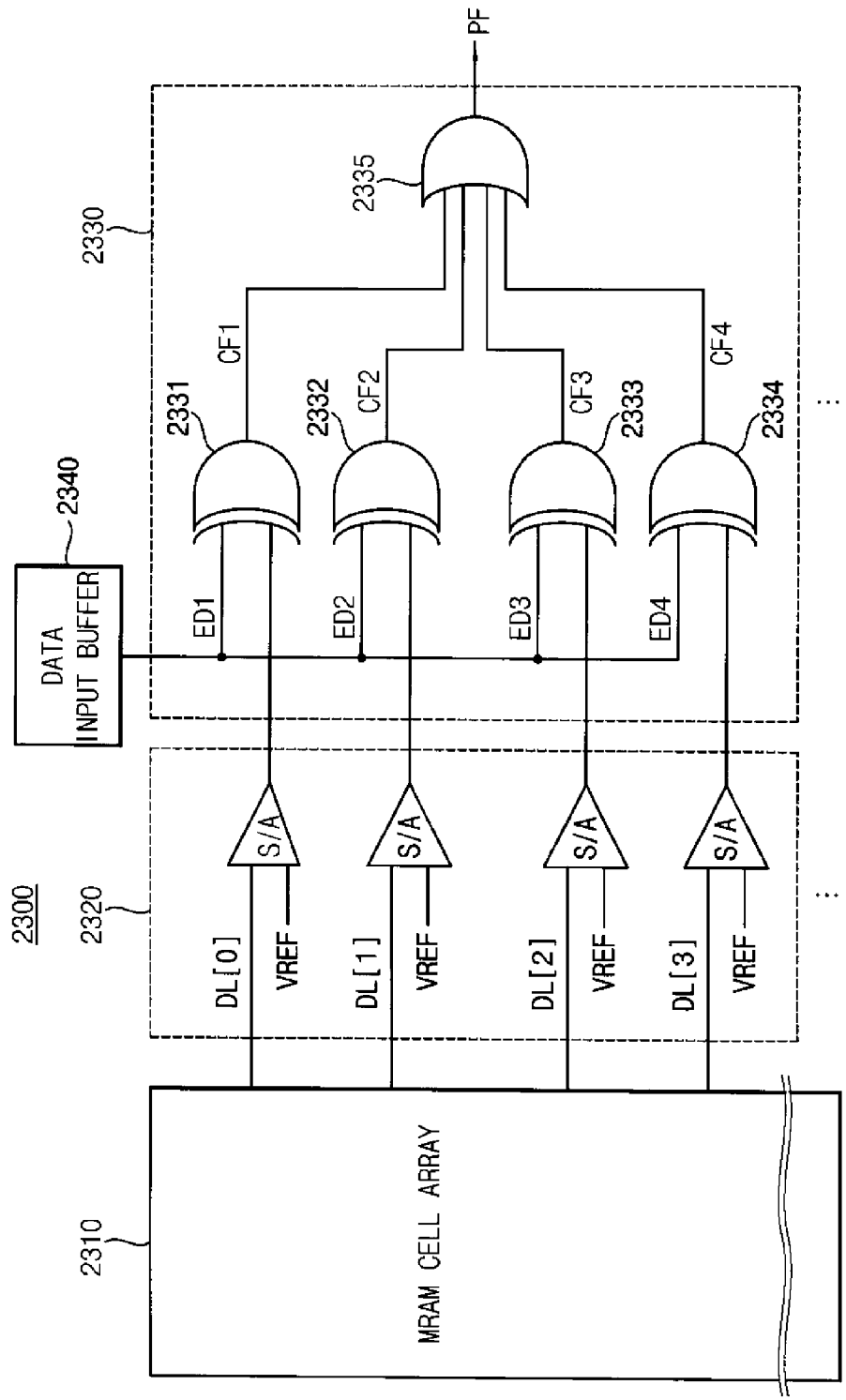
FIG. 18 is a diagram of a semiconductor memory illustrating a parallel bit test operation according to another example embodiment.

FIG. 18 is a diagram of a semiconductor memory device illustrating a parallel bit test operation according to another example embodiment. Referring to FIG. 18, the semiconductor memory device 2300 may include an MRAM cell array 2310, a sense amplifier circuit 2320, a parallel bit test circuit 2330 and a data input buffer 2340.

The parallel bit test circuit 2330 may include a plurality of XOR gates 2331, 2332, 2333 and 2334 and an OR gate 2335 to output comparison result data CF1, CF2, CF3 and CF4 indicating whether data from the MRAM cell array 2310 are failed or not.

The sense amplifier circuit 2320 compares the data voltages from the MRAM cell array 2310 with a reference voltage VREF and amplify the compared result to output digital data. The XOR gates 2331, 2332, 2333 and 2334 in the parallel bit test circuit 2330 compare the digital data output from the sense amplifier circuit 2320 with expectation data ED1, ED2, ED3 and ED4 stored in the data input buffer 2340, respectively, to generate comparison result data CF1, CF2, CF3 and CF4. Each of the comparisons result data CF1, CF2, CF3 and CF4 may have a logic low level when the two compared bits are identical and a logic high level when the two compared bits are different from each other.

The OR gate 2335 generates test result data PF based on the comparisons result data CF1, CF2, CF3 and CF4. The test result data PF may have the logic low level when all of the comparisons result data CF1, CF2, CF3 and CF4 have the logic low level, and the test result data PF may have the logic high level when at least one of the comparisons result data CF1, CF2, CF3 and CF4 has the logic high level.

Figure 19:
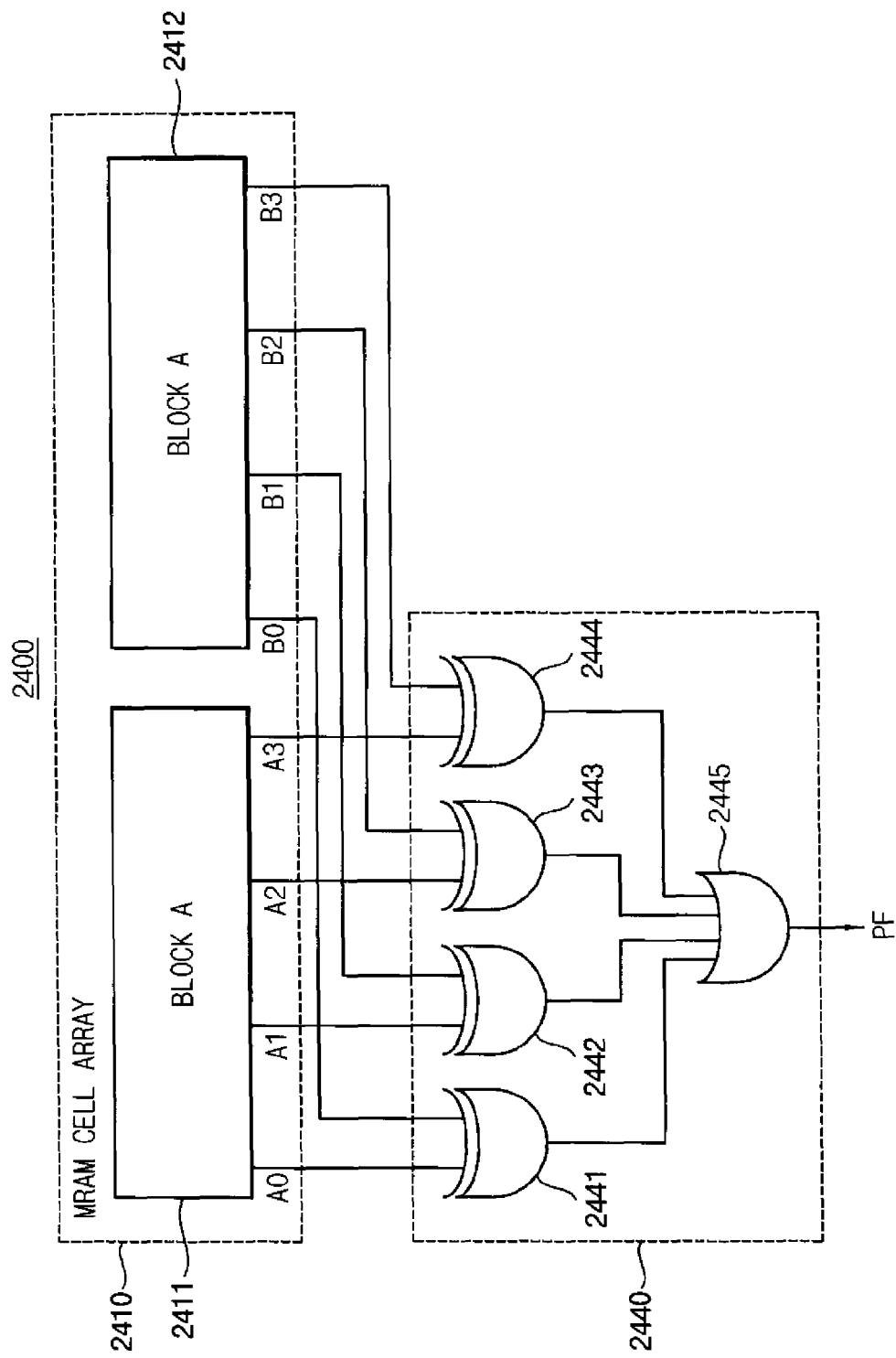
FIG. 19 is a diagram of a semiconductor memory device illustrating a parallel bit test operation according to an example embodiment.

FIG. 19 is a diagram of a semiconductor memory device 2400 illustrating a parallel bit test operation according to an example embodiment. Referring to FIG. 19, two memory blocks 2411 and 2412, which are selected among a plurality of memory blocks, may be tested simultaneously. For example, for the test, the same data have to be written in the memory blocks 2411 and 2412 in advance.

The parallel bit test circuit 2440 may detect the fail cells by comparing data A0, A1, A2 and A3 from the first memory block 2411 and data B0, B1, B2 and B3 from the second memory block 2412, respectively. The parallel bit test circuit 2440 may include a plurality of XOR gates 2441, 2442, 2443 and 2444 and an OR gate 2445. The test result signal PF from the parallel bit test circuit 2440 may have a logic low level (that is, a success signal) when identity of the data from the two memory blocks 2411 and 2412 is maintained, and a logic high level (that is, a failure signal) otherwise.

Figure 20A:
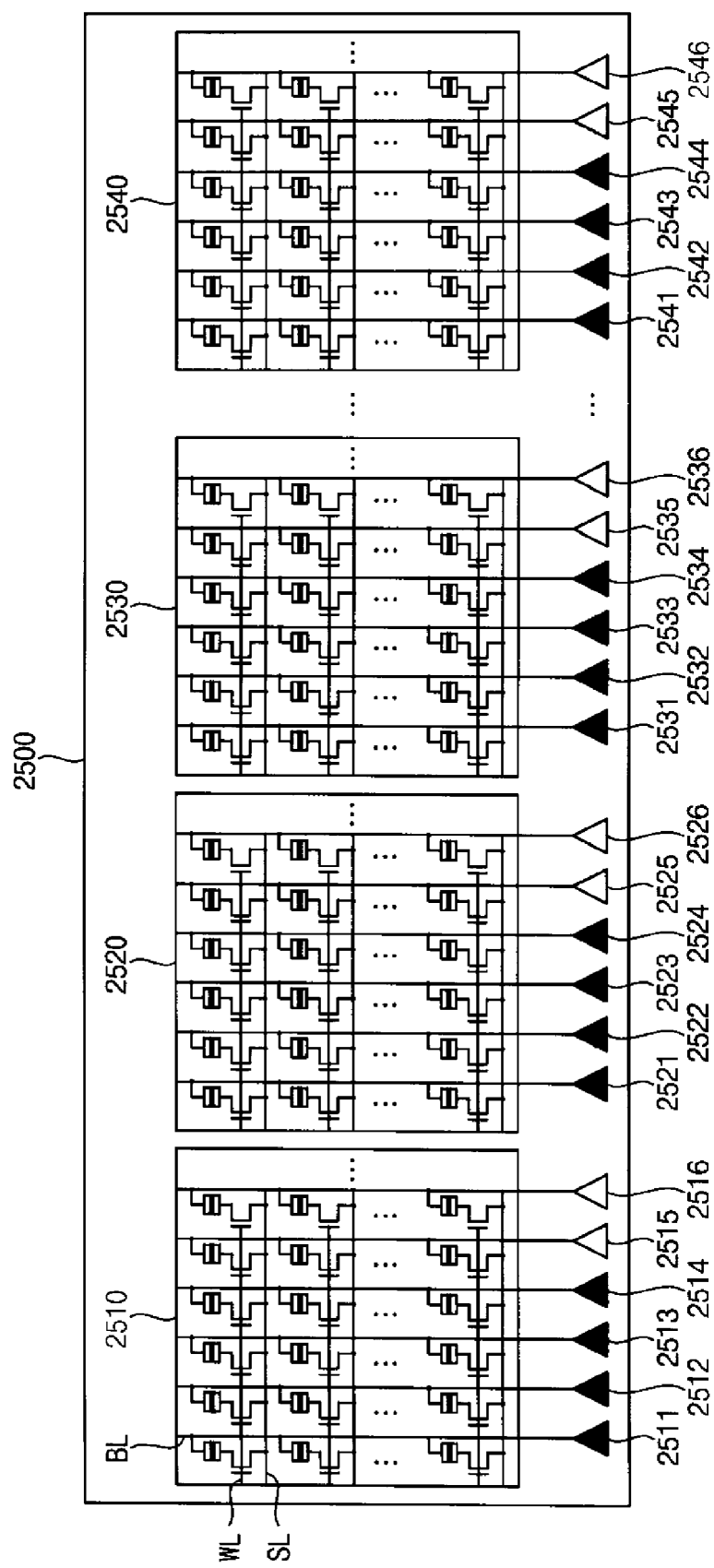
FIGS. 20A, 20B and 20C are diagrams illustrating methods of stabilizing a source voltage in a semiconductor memory device according to example embodiments.
Figure 20B:
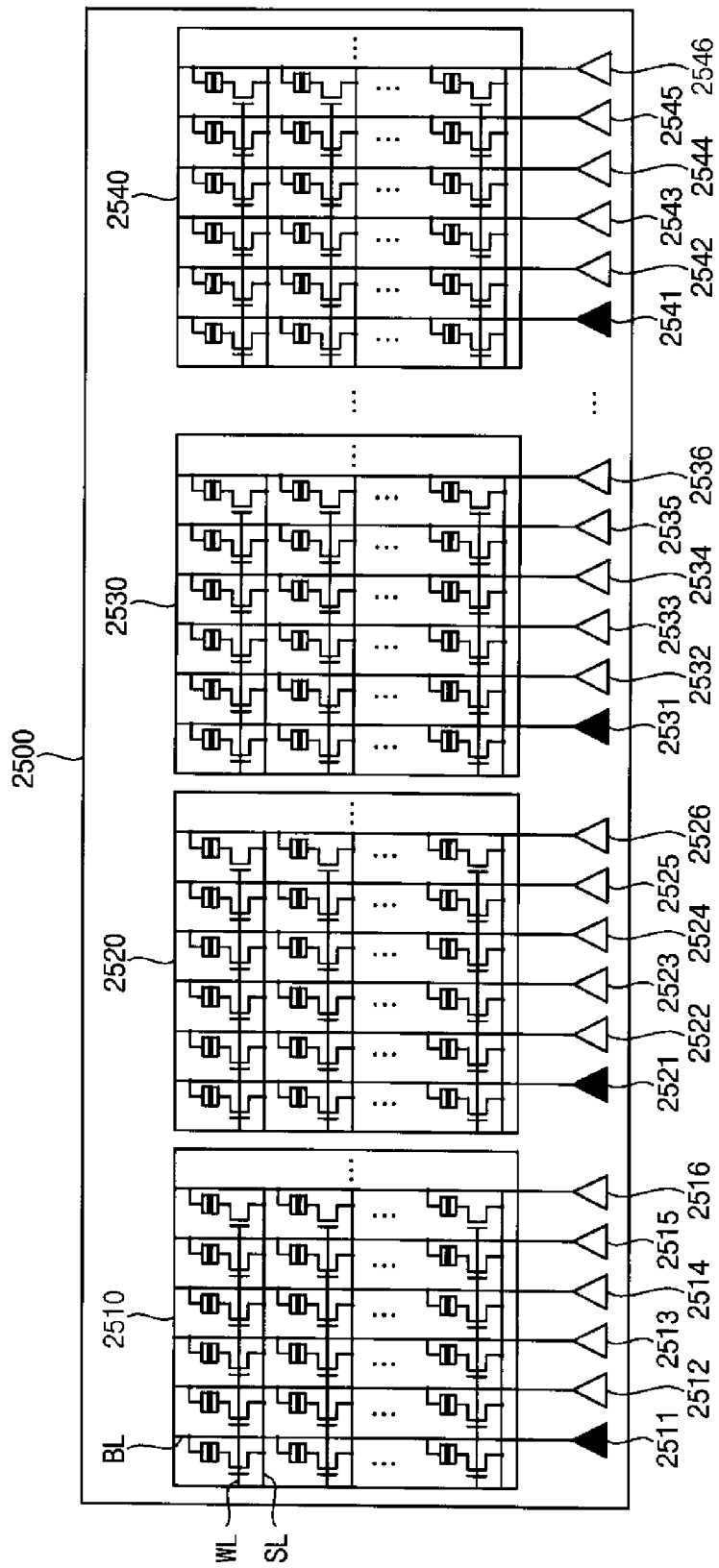
Figure 20C:
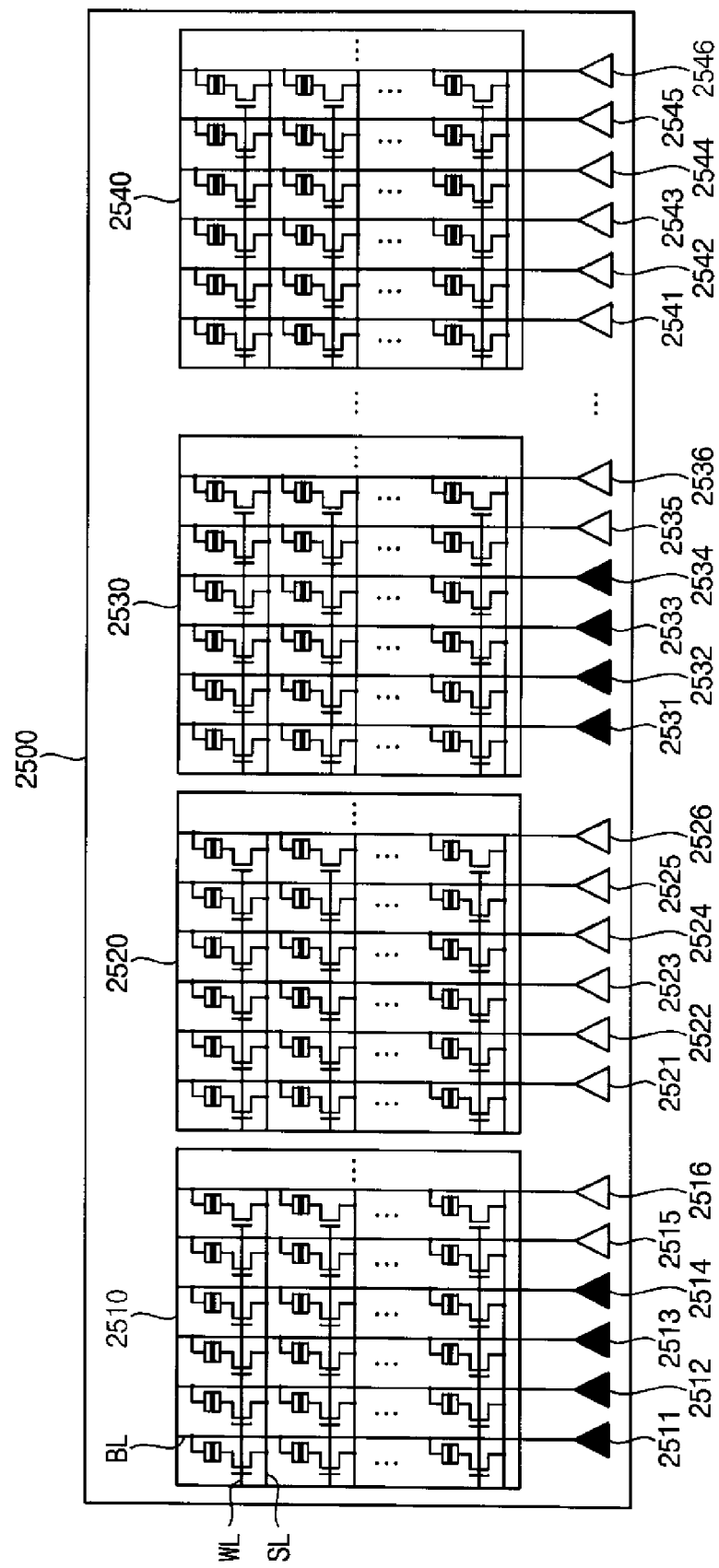

FIGS. 20A, 20B and 20C are diagrams illustrating methods of stabilizing a source voltage in a semiconductor memory device according to example embodiments. For the parallel bit test operation, data are written in the STT-MRAM cells and the written data are read out in parallel, that is, simultaneously. For example, the source line voltage may be increased when the write and read currents are applied to the STT-MRAM cells simultaneously. The source line voltage is the reference of the output data and the distribution of the cell resistance may be distorted if the source line voltage is unstable. To prevent errors in the test operation due to the unstable source line voltage, the number of the STT-MRAM cells, which are simultaneously tested in each memory block, may be changeable.

As illustrated in FIGS. 20A, 20B and 20C, a memory cell array 2500 may include a plurality of memory blocks (or sub blocks) 2510, 2520, 2530 and 2540. Each STT-MRAM cell is disposed in a cross area of each wordline WL and each bitline BL. The STT-MRAM cells in the memory blocks are commonly coupled to source lines and the source lines are electrically coupled to the source voltage generator 380 as illustrated in FIG. 3. In one embodiment, STT-MRAM cells in each memory block are commonly coupled to a respective common source line of each memory block. The bit lines are coupled to write drivers 2511~2516, 2521~2526, 2531~2536 and 2541~2546, respectively.

Referring to FIG. 20A, the semiconductor memory device 2500 may enable a plurality of write drivers in each memory block in the parallel bit test operation. For example, the four write drivers 2511, 2512, 2513, 2514 may be enabled in the first memory block 2510, the four write drivers 2521, 2522, 2523, 2524 may be enabled in the second memory block 2520, the four write drivers 2531, 2532, 2533, 2534 may be enabled in the third memory block 2530, and the four write drivers 2541, 2542, 2543, 2544 may be enabled in the fourth memory block 2540. Through the data lines coupled to the enabled write drivers, the test data may be written in the corresponding STT-MRAM cells. In this case, cell transistors in the large number of STT-MRAM cells are turned on simultaneously and the voltage of the source line SL may be increased and become unstable.

Referring to FIG. 20B, in the parallel bit test operation, the semiconductor memory device 2500 may change the number of the STT-MRAM cells, which are simultaneously written or read in each memory block to prevent the source line voltage from being unstable. For example, the one write driver 2511 may be enabled in the first memory block 2510, the one write driver 2521 may be enabled in the second memory block 2520, the one write driver 2531 may be enabled in the third memory block 2530, and the one write driver 2541 may be enabled in the fourth memory block 2540.

Referring to FIG. 20C, in the parallel bit test operation, the semiconductor memory device 2500 may change the number of the memory blocks, which are simultaneously written or read prevent the source line voltage from being unstable. As illustrated in FIG. 20C, the write drivers in the second and fourth memory blocks 2520 and 2540 may be disabled. For example, the four write drivers 2511, 2512, 2513, 2514 may be enabled in the first memory block 2510, and the four write drivers 2531, 2532, 2533, 2534 may be enabled in the third memory block 2530.

As such, the number of the STT-MRAM cells, which are tested simultaneously, may be changed and increase of the source line voltage may be reduced or prevented.

Hereinafter, a boundary scan test operation according to an example embodiment is described with reference to FIGS. 21, 22 and 23. The boundary scan test is for detecting inner connection fail of the semiconductor memory device including a boundary scan test circuit. The semiconductor memory device may include the STT-MRAM cells. In the boundary scan test mode, test pattern data are input through data input pads of the semiconductor memory device, the input test pattern data are transferred through internal paths to output test result data, and the test result data are compared with the test pattern data to detect the inner connection fail of the semiconductor memory device. When the test result data are different from the test pattern data, the inner connection fails such as short or open of the internal lines may be predicted.

Figure 21:
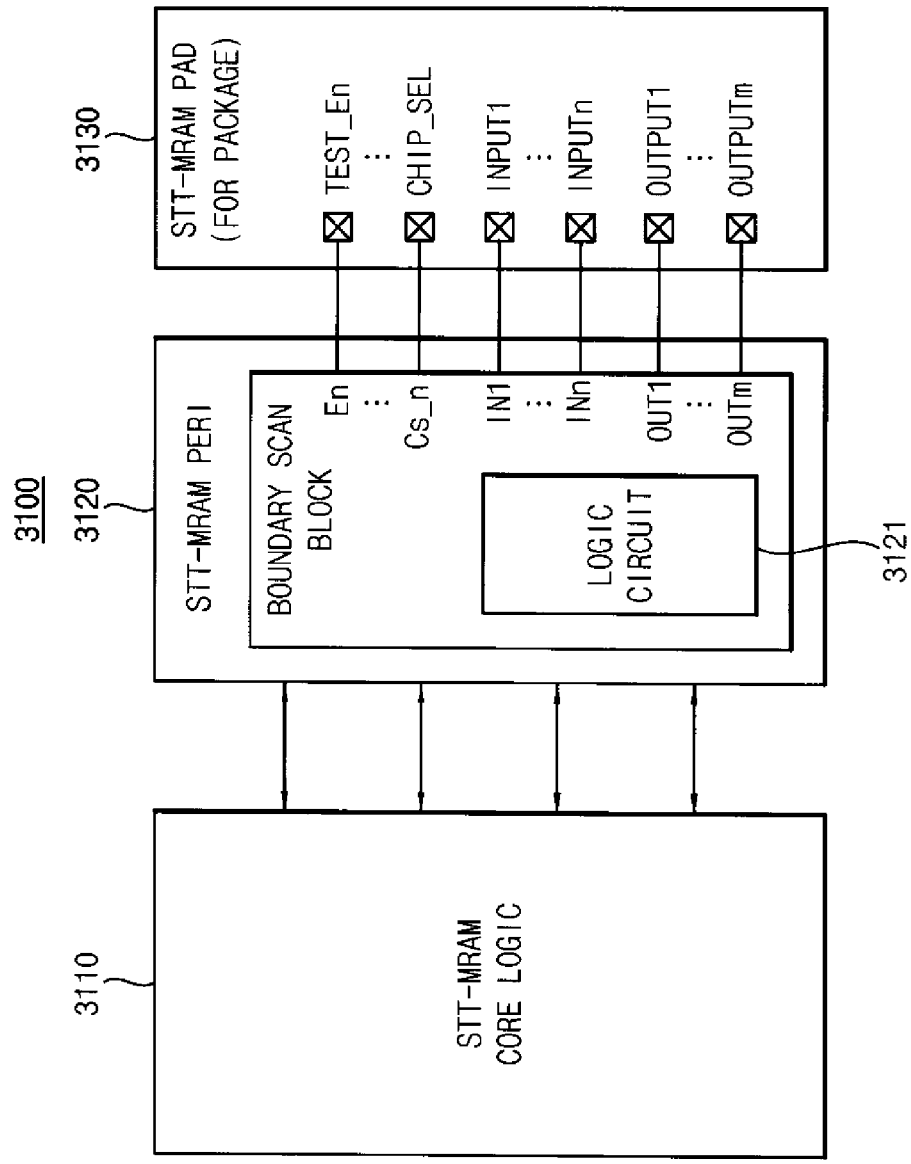
FIG. 21 is a diagram of a semiconductor memory device illustrating a boundary scan test operation according to an example embodiment.

FIG. 21 is a diagram of a semiconductor memory device illustrating a boundary scan test operation according to an example embodiment. Referring to FIG. 21, the semiconductor memory device 3100 may include a memory core logic region 3110, a peripheral region 3120 and a pad region 3130. The semiconductor memory device 3100 may be an STT-MRAM device.

The memory core logic region 3110 may include an STT-MRAM cell array as described above, and the peripheral region 3120 may include a boundary scan block including a logic circuit (e.g., a boundary scan test circuit) 3121 configured to process input-output operations of data and command.

In one embodiment, the boundary scan test mode may be performed by using the pads of the pad region 3130 when the semiconductor memory device is in a package state or a package level.

Control pads TEST_En and CHIP_SEL may be used for controlling the boundary scan test operation and the other pads may be assigned to data input pads INPUT1~INPUTn for receiving test pattern data and data output pads OUTPUT through OUTPUTm for providing output data, that is, the test result data. The input test pattern data applied to the input pads may be transferred through the logic circuit 3121 and then the transferred data may be output though the output pads of the pad region 3130. The test pattern data may be digital signals or analog signals.

Figure 22:
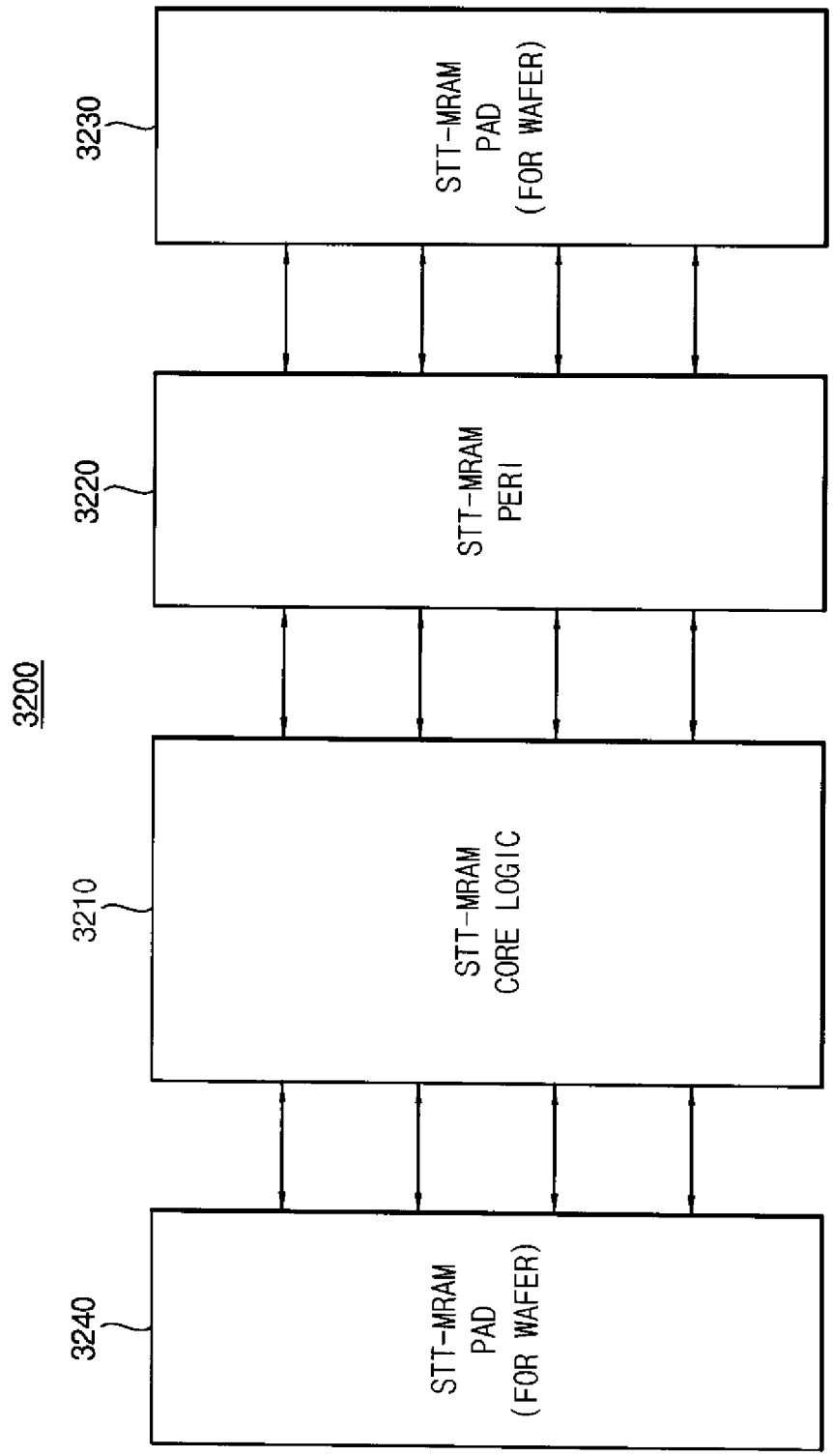
FIG. 22 is a diagram of a semiconductor memory device illustrating a boundary scan test operation according to another example embodiment.

FIG. 22 is a diagram of a semiconductor memory device illustrating a boundary scan test operation according to another example embodiment. Referring to FIG. 22, the semiconductor memory device 3200 may include a memory core logic region 3210, a peripheral region 3220 and pad regions 3230 and 3240. The semiconductor memory device 3200 may be an STT-MRAM device.

In one embodiment, the boundary scan test mode may be performed using the pads of the pad regions 3230 and 3240 when the semiconductor memory device is in a wafer state or a wafer level. In the wafer-level test, a combination of digital signals is input through the input pads of the pad regions 3230 and 3240 and the result logic signals are output through the output pads of the pad regions 3230 and 3240. If the analog signals are input through the input pads, the signals of DC voltage levels may be output through the output pads.

The components in the semiconductor memory device 3200 of FIG. 22 are the same as or similar to those of the semiconductor memory device 3100 of FIG. 21, and thus the detailed descriptions are omitted.

Figure 23:
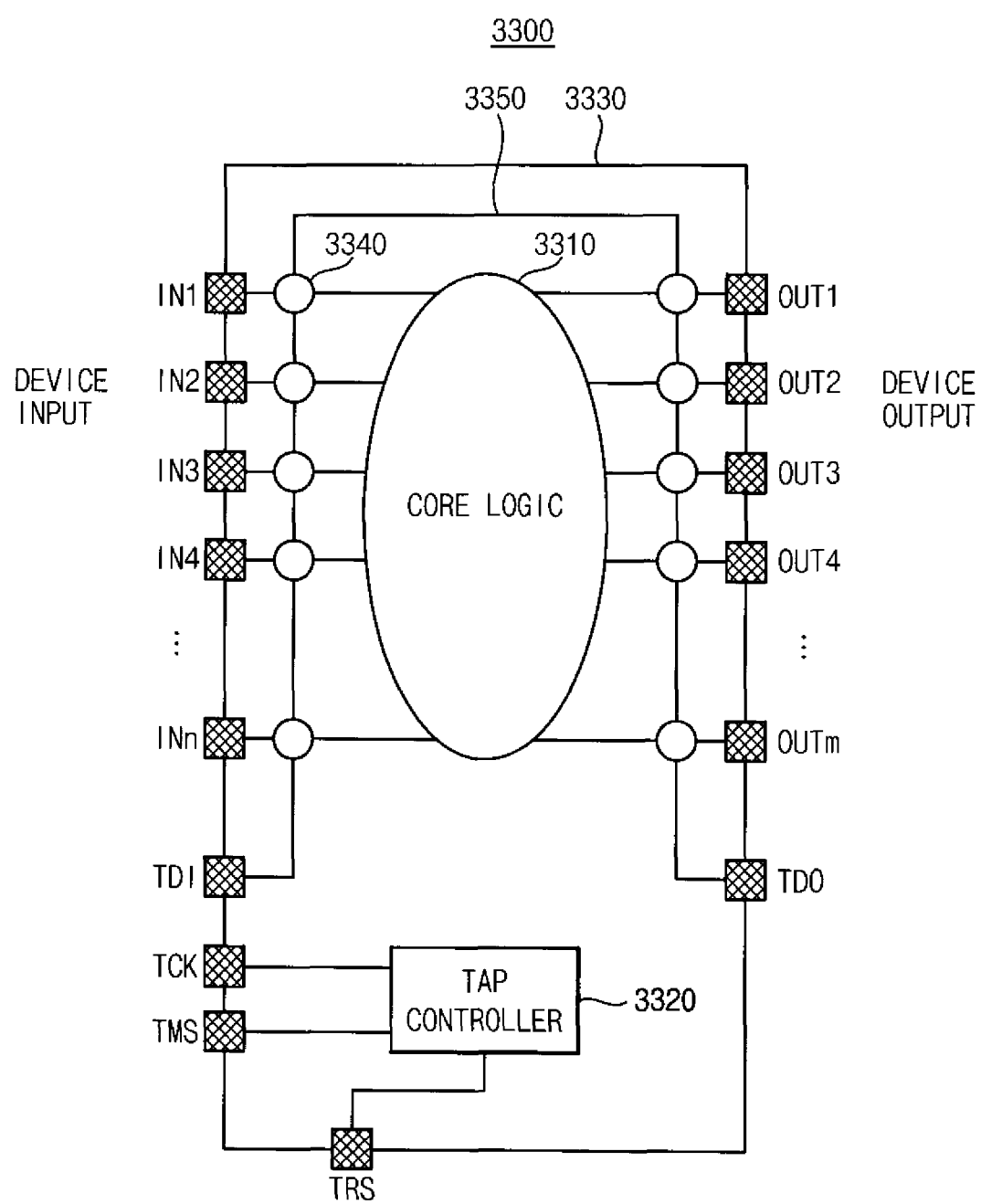
FIG. 23 is a diagram illustrating a semiconductor memory device including a boundary scan test circuit according to an example embodiment.

FIG. 23 is a diagram illustrating a semiconductor memory device including a boundary scan test circuit according to an example embodiment. Referring to FIG. 23, the semiconductor memory device 3300 may include a core logic 3310, a test access port (TAP) controller 3320 and an assembly 3330 of pads including a plurality of data input pads IN1~INn, a plurality of data output pads OUT1~OUTm and test access ports TDI, TCK, TRS, TMS and TDO.

Boundary scan cells 3340 may be electrically coupled to the input-output pads IN1~INn and OUT1~OUTm, respectively. The test access ports may include a test data input (TDI) port receiving the test data, a test data output (TDO) port providing the test result data, a test mode select (TMS) port receiving a signal indicating a test mode, a test clock (TCK) port receiving a test clock signal and a test reset signal (TRS) port receiving a test reset signal.

The TAP controller 3320 is synchronized with the clock signal that is input through the TCK port, and triggers a data shift operation between the boundary scan cells 3340 in response to the signal that is input though the TMS port. Through the data shift operation synchronized with the clock signal, data communication between the boundary scan cells 3340 and the core logic 3310 or between the input pads IN1~INn and the output pads OUT1~OUTm.

In one embodiment, the serialized test data may be input through the TDI port from an external host and the input test data may be shifted sequentially through the boundary scan cells 3340. The data transferred through the boundary scan cells 3340 may be send back in serial to the host through the TDO port. The host compares the sent data and the returned data to detect the inner connection fails of the semiconductor memory device 3300.

Figure 24:
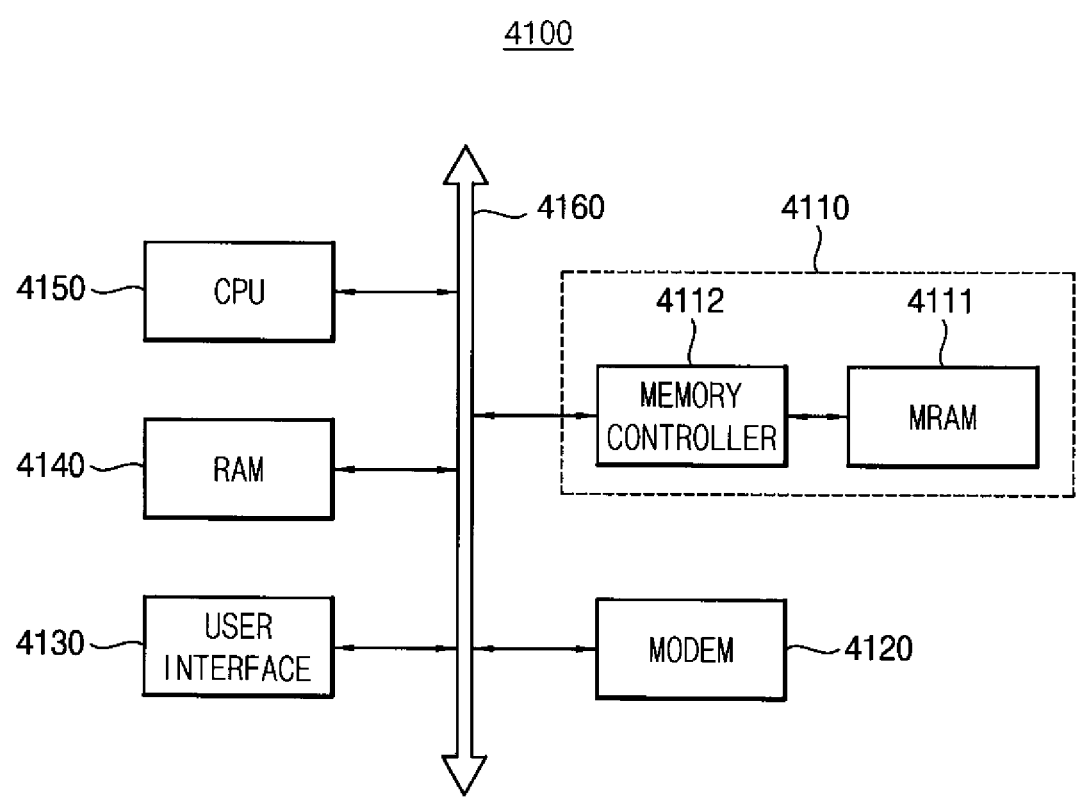
FIG. 24 is a block diagram illustrating a computing system including a semiconductor memory device according to an example embodiment.

FIG. 24 is a block diagram illustrating a computing system including a semiconductor memory device according to an example embodiment.

Referring to FIG. 24, a computing system 4100 may be a mobile device or a desktop computer including a semiconductor memory device disclosed herein. The computing system 4100 may include an MRAM memory system 4110, a modem 4120, a user interface 4130, a random access memory (RAM) 4140 and a central processing unit (CPU) 4150, which are electrically coupled to a system bus 4160.

The MRAM memory system 4110 may include a semiconductor memory device 4111 disclosed herein and a memory controller 4112. The semiconductor memory device 4111 may store data processed by the CPU 4150 and/or data provided from external devices.

At least one of the semiconductor memory device 4111 and the RAM 4140 may be an MRAM device including the STT-MRAM cells. For example, the MRAM cells may be included in the semiconductor memory device 4111 for storing large amount of data and/or the RAM requiring rapid access time for system data. Even though not illustrated in FIG. 24, the computing system 4100 may further include an application chipset, an image sensor, input-output devices such as a keyboard, a monitor, etc.

Figure 25:
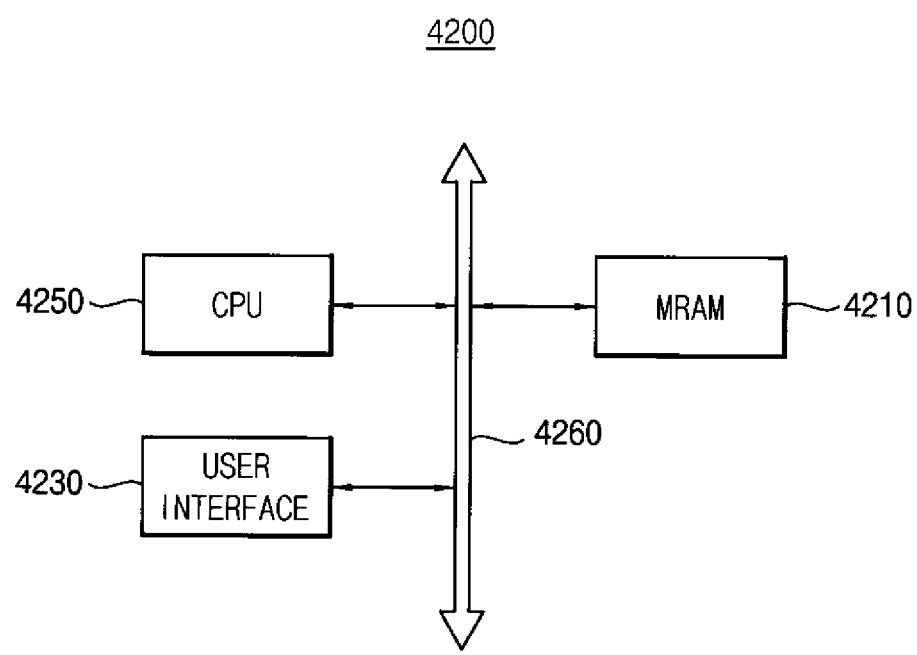
FIG. 25 is a block diagram illustrating a computing system including a semiconductor memory device according to another example embodiment.

FIG. 25 is a block diagram illustrating a computing system including a semiconductor memory device according to another example embodiment.

Referring to FIG. 25, a computing system 4200 may be a mobile device or a desktop computer including a semiconductor memory device disclosed herein. The computing system 4200 may include a semiconductor memory device 4210 including MRAM cells, a user interface 4230, and a central processing unit (CPU) 4250, which are electrically coupled to a system bus 4260.

The STT-MRAM device is a next-generation memory having advantages of low cost and high capacity of DRAM, high operational speed of SRAM and non-volatility of flash memory. Thus the one MRAM device 4210 may substitute all of a cache memory requiring high speed, a RAM and a storage of high capacity, which have been distinctively implemented in the conventional systems. For example, the MRAM memory device 4210 may have high capacity and high operational speed and thus the computing system may have a compact configuration with smaller size.

The foregoing is illustrative of example embodiments and is not to be construed as limiting thereof. Although a few example embodiments have been described, those skilled in the art will readily appreciate that many modifications are possible in the exemplary embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor memory device comprising:
a memory cell array including a plurality of wordlines, a plurality of bitlines, and a plurality of spin-transfer torque magneto-resistive random access memory (STT-MRAM) cells, each STT-MRAM cell disposed in a cross area of each wordline and bitline, and the STT-MRAM cell including a magnetic tunnel junction (MTJ) element and a cell transistor, the MTJ element including a free layer, a barrier layer and a pinned layer, a gate of the cell transistor coupled to a wordline, a first electrode of the cell transistor coupled to a bitline via the MTJ element, a second electrode of the cell transistor coupled to a source line;
a mode register set configured to set a test mode; and
a test circuit configured to perform a test operation by using the mode register set.

2. The semiconductor memory device of claim 1, wherein the test mode includes at least one of a read leveling test mode for adjusting a skew between a clock signal and a data strobe signal, a parallel bit test mode for detecting failed cells among the STT-MRAM cells, and a boundary scan test mode for detecting inner connection fail of the semiconductor memory device.

3. The semiconductor memory device of claim 2, wherein the test circuit includes:
a pattern storage circuit configured to store a predetermined data pattern; and
a selection circuit configured to output normal data read from the memory cell array in a normal mode and output the data pattern provided from the pattern storage circuit in the read leveling test mode.

4. The semiconductor memory device of claim 3, further comprising:
an output control circuit configured to block an access to the memory cell array and control an output latency of the data pattern provided from the pattern storage circuit, in the read leveling test mode.

5. The semiconductor memory device of claim 4, wherein the output control circuit includes a delay-locked loop circuit that is enabled in the read leveling test mode.

6. The semiconductor memory device of claim 3, wherein the pattern storage circuit includes a register.

7. The semiconductor memory device of claim 3, further comprising:
a write driver configured to drive the pattern storage circuit, wherein the pattern storage circuit includes a plurality of STT-MRAM cells.

8. The semiconductor memory device of claim 3, wherein the pattern storage circuit is arranged in the memory cell array.

9. The semiconductor memory device of claim 3, wherein the test circuit further includes a read leveling command decoder configured to generate a read leveling signal based on values stored in the mode register set, and
wherein the pattern storage circuit is enabled in response to the read leveling signal.

10. The semiconductor memory device of claim 2, wherein the memory cell array includes a plurality of memory blocks, each of the memory blocks including a plurality of STT-MRAM cells coupled to data lines, and
wherein the test circuit includes:
a comparison circuit configured to compare first data received through first data lines with second data to generate comparison result data in the parallel bit test mode; and
a calculation circuit configured to perform a logic operation on the comparison result data to generate test result data.

11. The semiconductor memory device of claim 10, wherein the data lines includes the first data lines and second data lines,
wherein the second data is received through the second data lines,
wherein the comparison circuit includes a plurality of exclusive-OR gates configured to provide the comparison result data based on the first data and the second data, and
wherein the calculation circuit includes a plurality of OR gates configured to provide the test result data based on the comparison result data.

12. The semiconductor memory device of claim 10, wherein the data lines includes the first data lines and second data lines,
wherein the memory blocks include a first memory block connected to the first data lines, and a second memory block connected to the second data lines,
wherein the comparison circuit includes a plurality of exclusive-OR gates configured to provide the comparison result data based on the first data and the second data, and
wherein the calculation circuit includes a plurality of OR gates configured to provide the test result data based on the comparison result data.

13. The semiconductor memory device of claim 10, further comprising:
a data input buffer configured to provide second data to the comparison circuit,
wherein the comparison circuit includes a plurality of exclusive-OR gates configured to provide the comparison result data based on the first data and the second data, and
wherein the calculation circuit includes a plurality of OR gates configured to provide the test result data based on the comparison result data.

14. The semiconductor memory device of claim 10, wherein the STT-MRAM cells of the memory blocks are commonly coupled to source lines and the source lines are electrically coupled to a source voltage generator.

15. The semiconductor memory device of claim 10, wherein each of the memory blocks includes a plurality of write drivers configured to write data to the plurality of STT-MRAM cells of each memory block, and
wherein a number of the STT-MRAM cells of each of the memory blocks to be simultaneously written in the parallel bit test mode, is variable.

16. The semiconductor memory device of claim 15, wherein the number of the STT-MRAM cells to be simultaneously written is variable based on a number of the write drivers of each memory block simultaneously enabled.

17. The semiconductor memory device of claim 2, further comprising:
a boundary scan test circuit configured to receive test pattern data from input pads of the semiconductor memory device, and output the test pattern data to output pads of the semiconductor memory device,
wherein, the boundary scan test circuit is configured to receive and output the test pattern data in the boundary scan test mode.

18. The semiconductor memory device of claim 17, wherein the boundary scan test circuit is configured to perform when the semiconductor memory device is in a wafer state.

19. The semiconductor memory device of claim 18, wherein the test pattern data includes digital signals or analog signals.

20. A semiconductor memory device comprising:
a memory cell array including a plurality of non-volatile memory cells;
a mode register set configured to set a test operation mode; and
a test circuit configured to perform the test operation mode by using the mode register set, the test circuit comprising:
a read leveling command decoder configured to generate a read leveling signal based on values stored in the mode register set;
a pattern storage circuit configured to store a predetermined data pattern and provide the data pattern when the read leveling signal is activated; and
a selection circuit configured to output data read from the memory cell array when the read leveling signal is deactivated and output the data pattern provided from the pattern storage circuit when the read leveling signal is activated.

21. The semiconductor memory device of claim 20, wherein the non-volatile memory cells are at least one of a phase-change random access memory (PRAM), a resistance random access memory (RRAM), a ferroelectrics random access memory (FRAM) and a magneto-resistive random access memory (MRAM).

22. The semiconductor memory device of claim 20, further comprising:
a row decoder configured to select one or more wordlines connected to a plurality of non-volatile memory cells disposed in a row; and
a column decoder configured to select one or more bitlines connected to a plurality of non-volatile memory cells disposed in a column,
wherein the mode register set is configured to set a normal operation mode, and
wherein the column decoder is configured to select one or more bitlines in the normal operation mode, and does not select any bitline in the test operation mode.

23. The semiconductor memory device of claim 20, further comprising:
a row command decoder configured to activate the row decoder by decoding an active command; and
a delay-locked loop configured to control an output latency of read data, the read data including normal data read from the memory cell array and the data pattern provided from the pattern storage circuit,
wherein the delay-locked loop is enabled regardless of the active command to control the output latency of the data pattern when the read leveling signal is activated.

24. A semiconductor memory device comprising:
a first memory cell array including a plurality of magneto-resistive random access memory (MRAM) cells configured to store and read data in a first operation mode of the semiconductor memory device;
a second memory cell array including a plurality of MRAM cells configured to store and read data in a second operation mode of the semiconductor memory device;
a mode register set configured to set the first and second operation modes; and
a data output circuit configured to output the data read from the first memory cell array in the first operation mode and output the data read from the second memory cell array in the second operation mode,
wherein the first operation mode is a normal operation mode and the second operation mode is a test operation mode.

25. The semiconductor memory device of claim 24, wherein each of the MRAM cells is a spin-transfer torque magneto-resistive random access memory (STT-MRAM) cell.

26. The semiconductor memory device of claim 24, further comprising:
a row decoder configured to select a wordline connected to a plurality of MRAM cells disposed in a row of the first memory cell array; and
a column decoder configured to select a bitline connected to a plurality of MRAM cells disposed in a column of the first memory cell array,
wherein the column decoder is configured to select a bitline in the first operation mode, and does not select any bitline in the second operation mode.

27. The semiconductor memory device of claim 26, wherein the first cell array includes a plurality of memory blocks, each of the memory blocks having a plurality of MRAM cells,
wherein each of the memory blocks includes a plurality of write drivers configured to write data to the plurality of MRAM cells of each of the memory blocks, and
wherein a number of the write drivers of each of the memory blocks simultaneously enabled is variable.

28. The semiconductor memory device of claim 24, further comprising:
a read leveling command decoder configured to generate a read leveling signal based on values stored in the mode register set; and
a selection circuit configured to output the data read from the first memory cell array when the read leveling signal is deactivated and output the data read from the second memory cell array when the read leveling signal is activated.

29. The semiconductor memory device of claim 24, wherein the data stored in the second memory cell array is predetermined data pattern.

30. The semiconductor memory device of claim 24, wherein the first memory cell array is spaced apart from the second memory cell array.

\* \* \* \* \*